United States Patent
Oh et al.

(10) Patent No.: US 12,302,567 B2
(45) Date of Patent: May 13, 2025

(54) THREE-DIMENSIONAL MEMORY DEVICE AND MANUFACTURING METHOD THEREOF

(71) Applicant: SK hynix Inc., Icheon-si (KR)

(72) Inventors: Sung Lae Oh, Icheon-si (KR); Sang Hyun Sung, Icheon-si (KR); Hyun Soo Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 535 days.

(21) Appl. No.: 17/703,893

(22) Filed: Mar. 24, 2022

(65) Prior Publication Data

US 2023/0129701 A1    Apr. 27, 2023

(30) Foreign Application Priority Data

Oct. 25, 2021   (KR) .................. 10-2021-0142597

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 41/50; H10B 43/50; H10B 43/30; H10B 43/40
See application file for complete search history.

(56) References Cited

U.S. PATENT DOCUMENTS 10,930,587 B2    2/2021   Oh
2020/0295028 A1*   9/2020   Kim ................ H10B 43/30

FOREIGN PATENT DOCUMENTS

KR  10-2012-0035399 A   4/2012
KR  10-2018-0110797 A   10/2018

* cited by examiner

*Primary Examiner* — Kyoung Lee

(57) ABSTRACT

A three-dimensional memory device and a manufacturing method thereof. The three-dimensional memory device includes an electrode structure including a plurality of electrode layers and a plurality of interlayer dielectric layers which are alternately stacked on a substrate; and a plurality of through holes passing through the electrode structure in a vertical direction, and including pad regions at the transition between portions of the through holes have different widths.

11 Claims, 48 Drawing Sheets

FIG.1
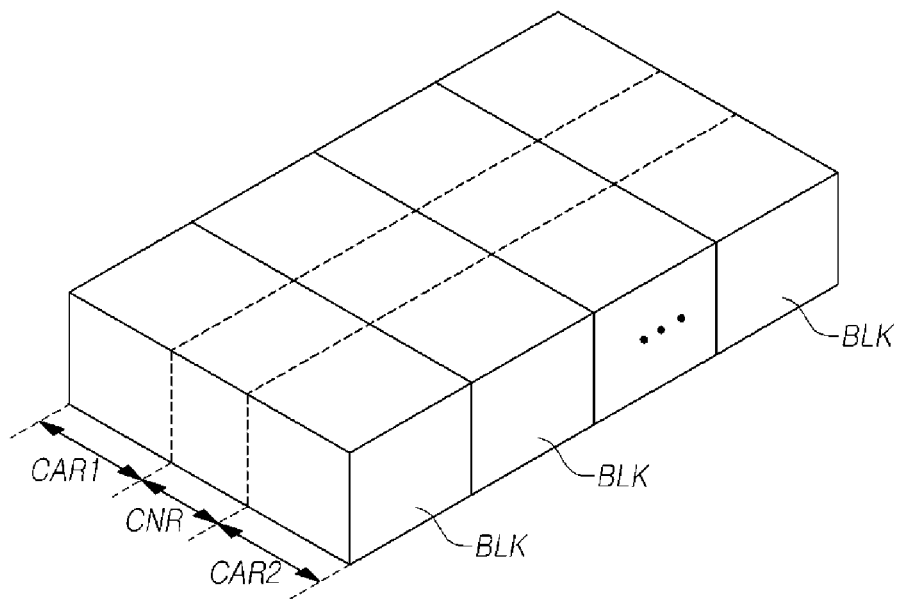
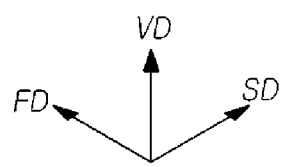

FIG.4C
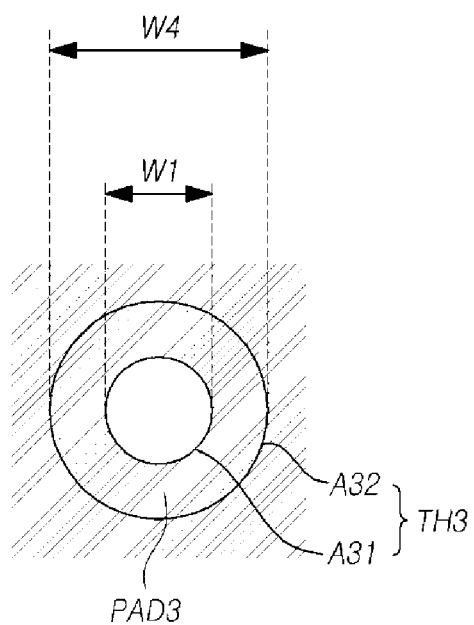
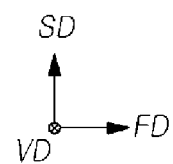

FIG.4D
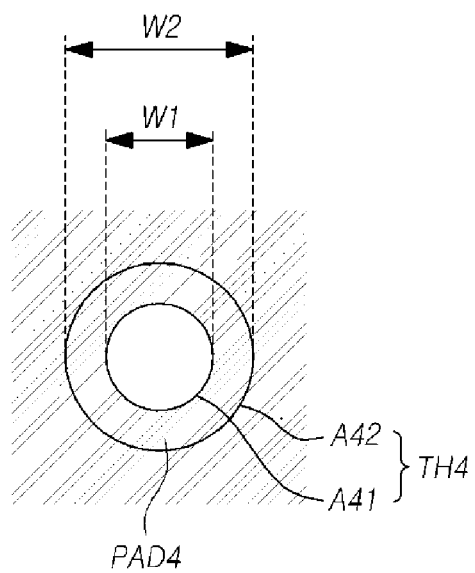
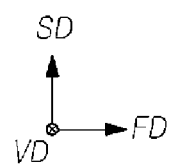

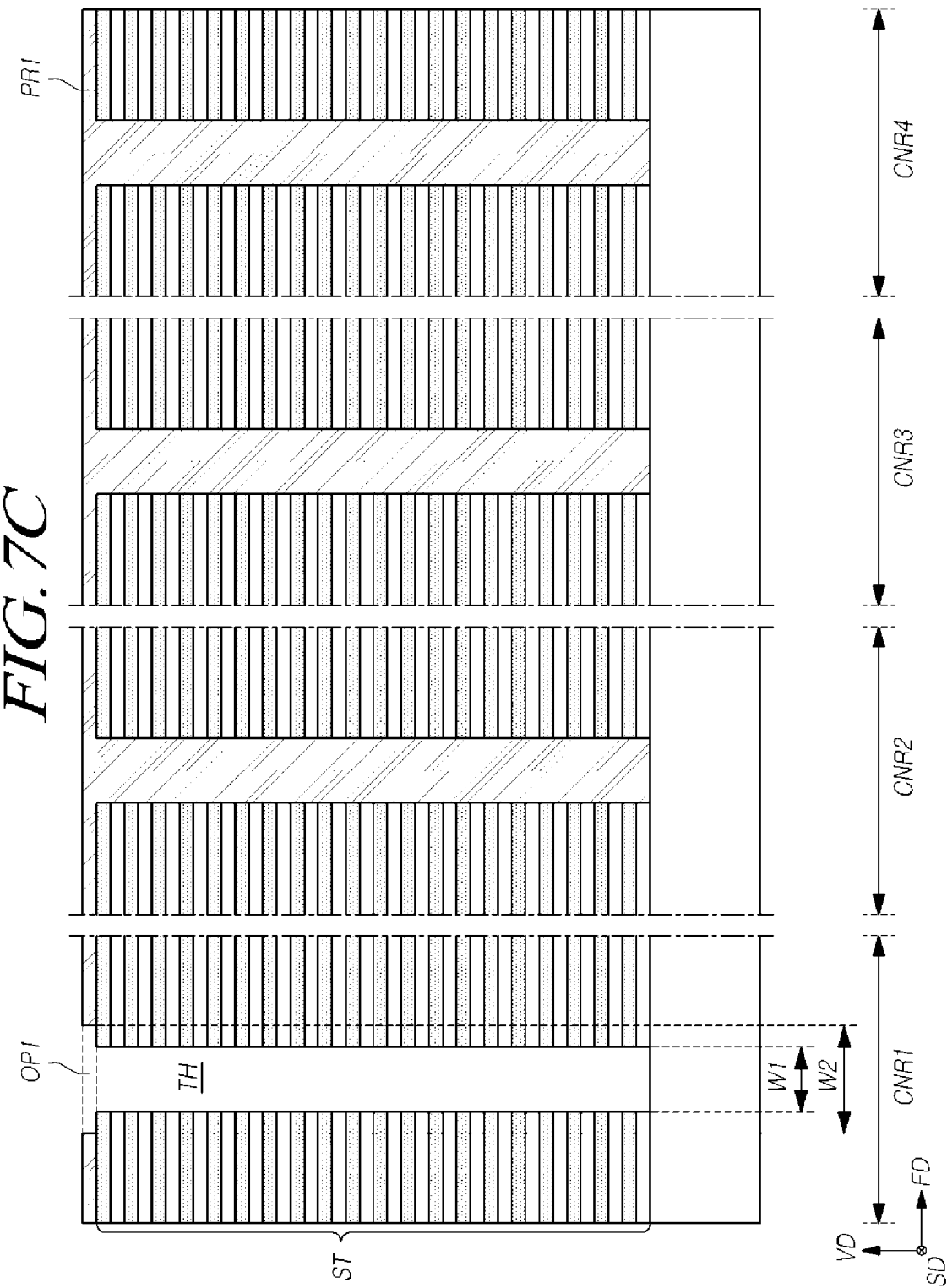

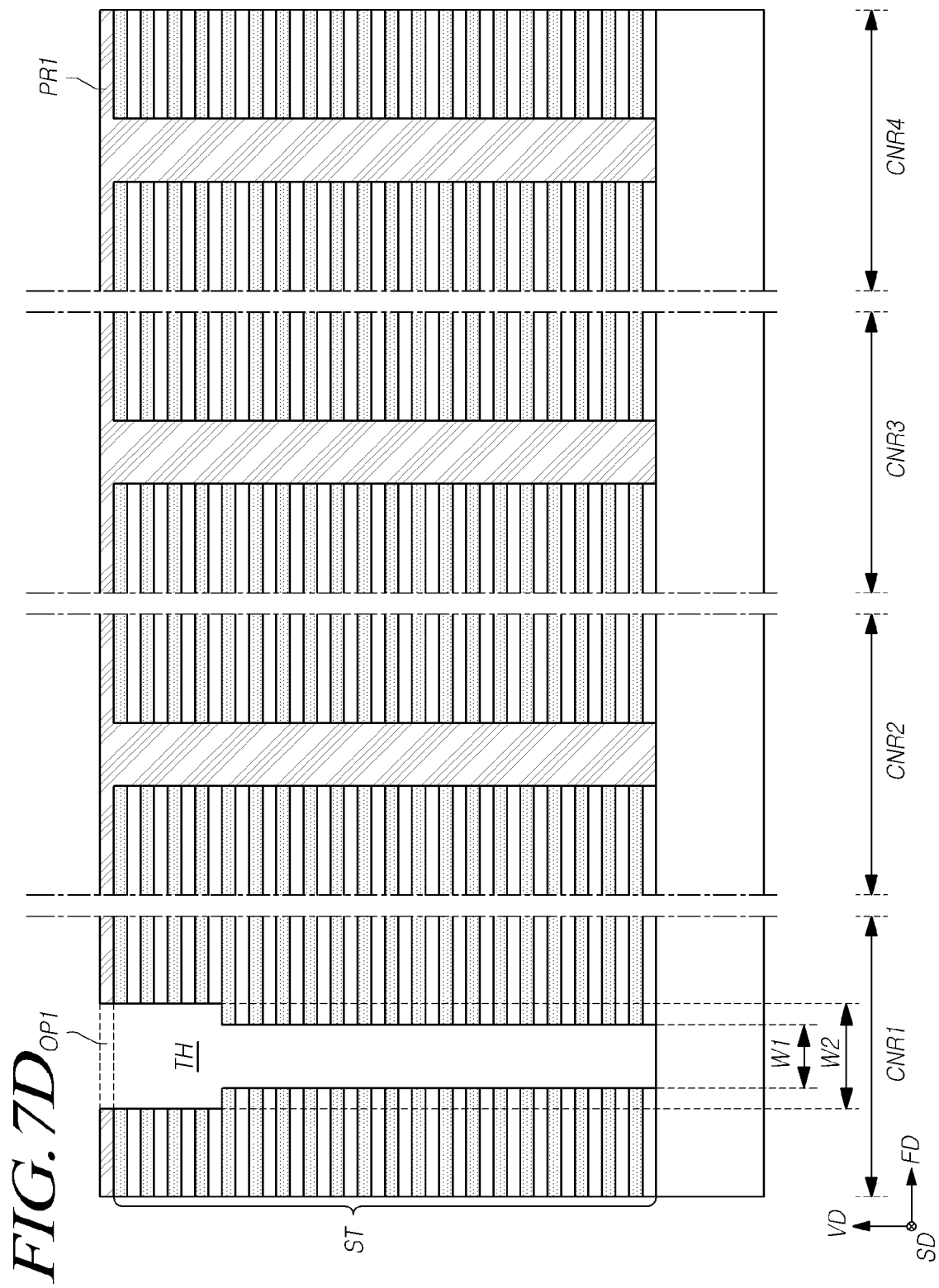

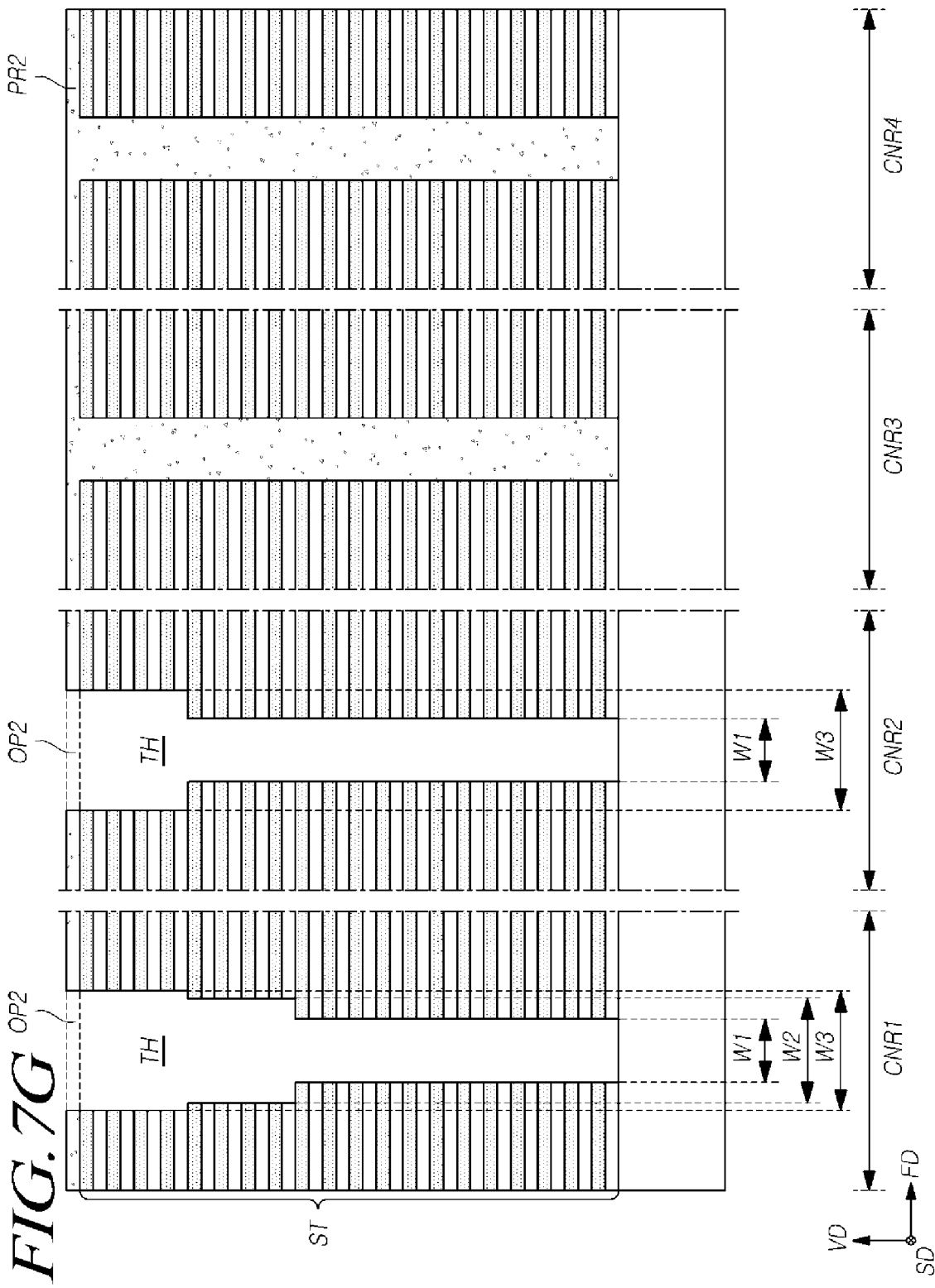

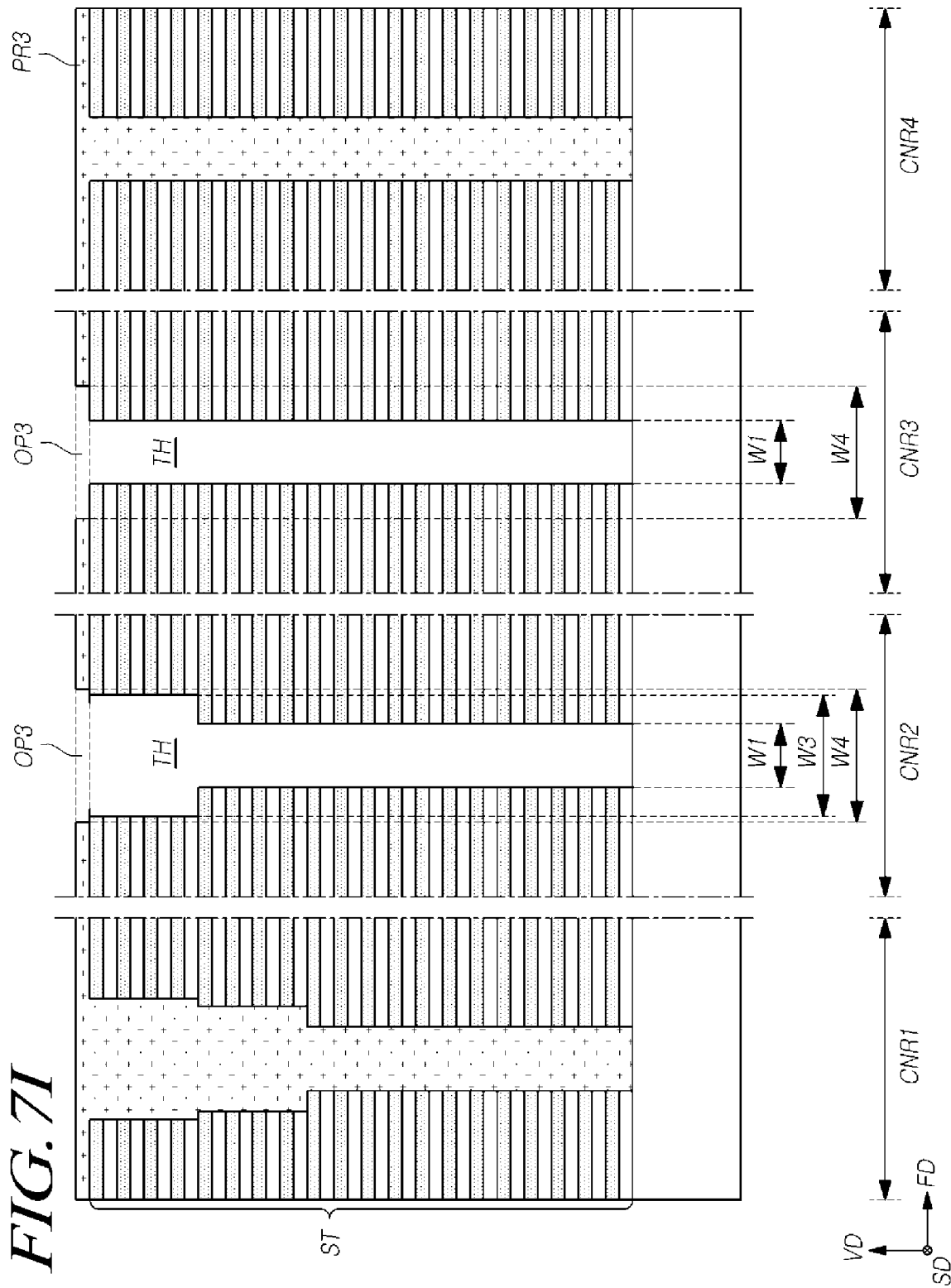

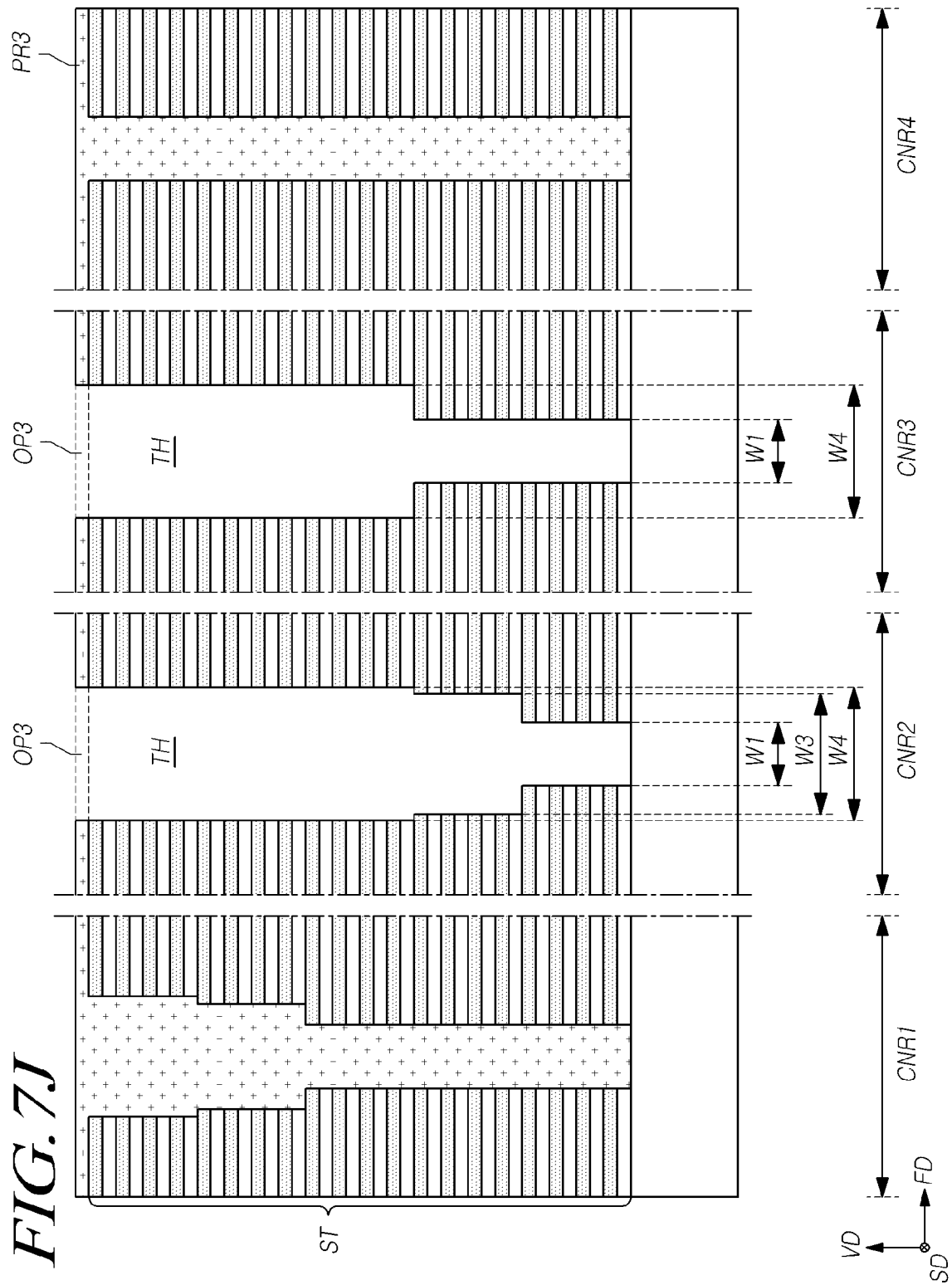

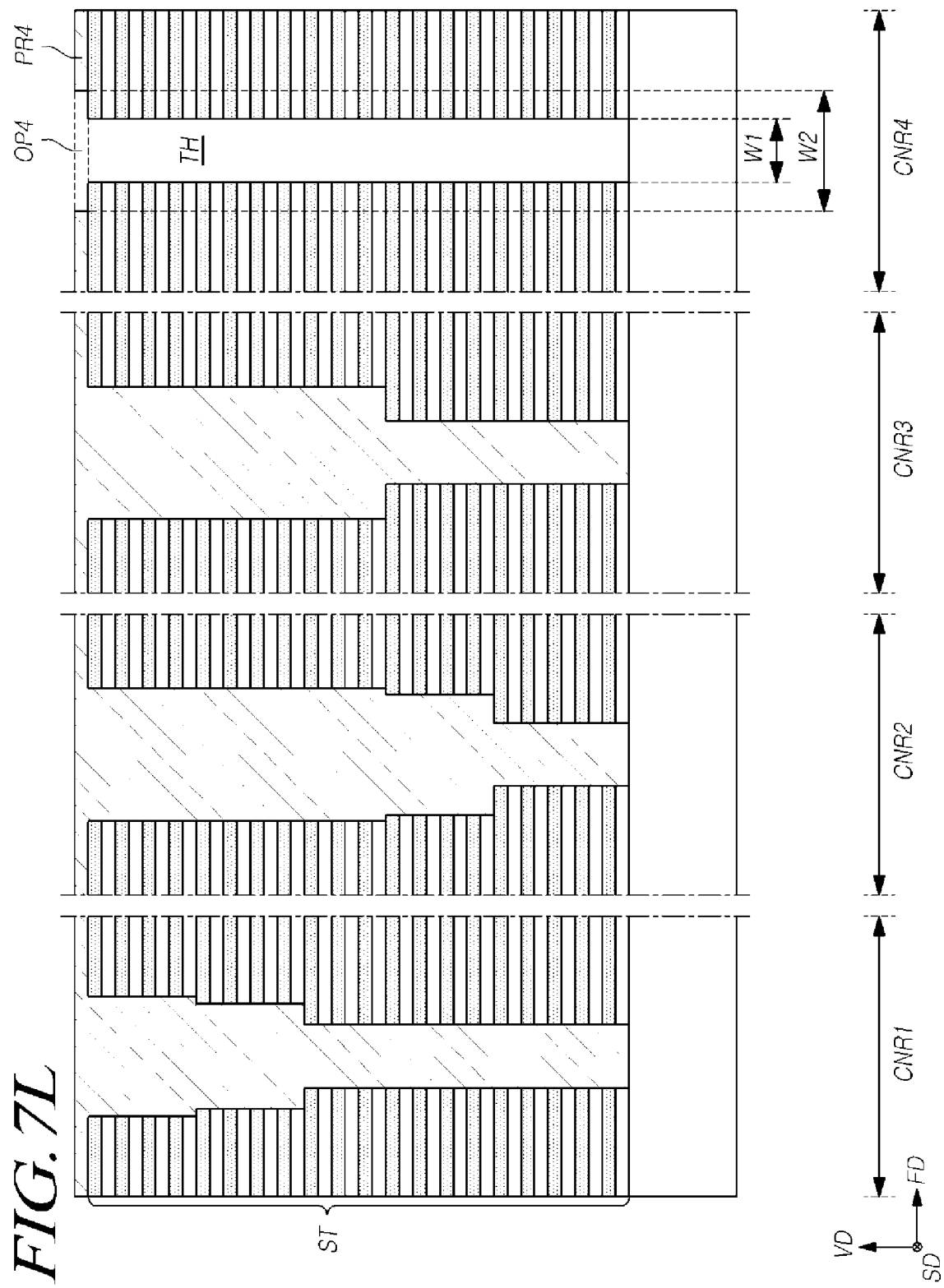

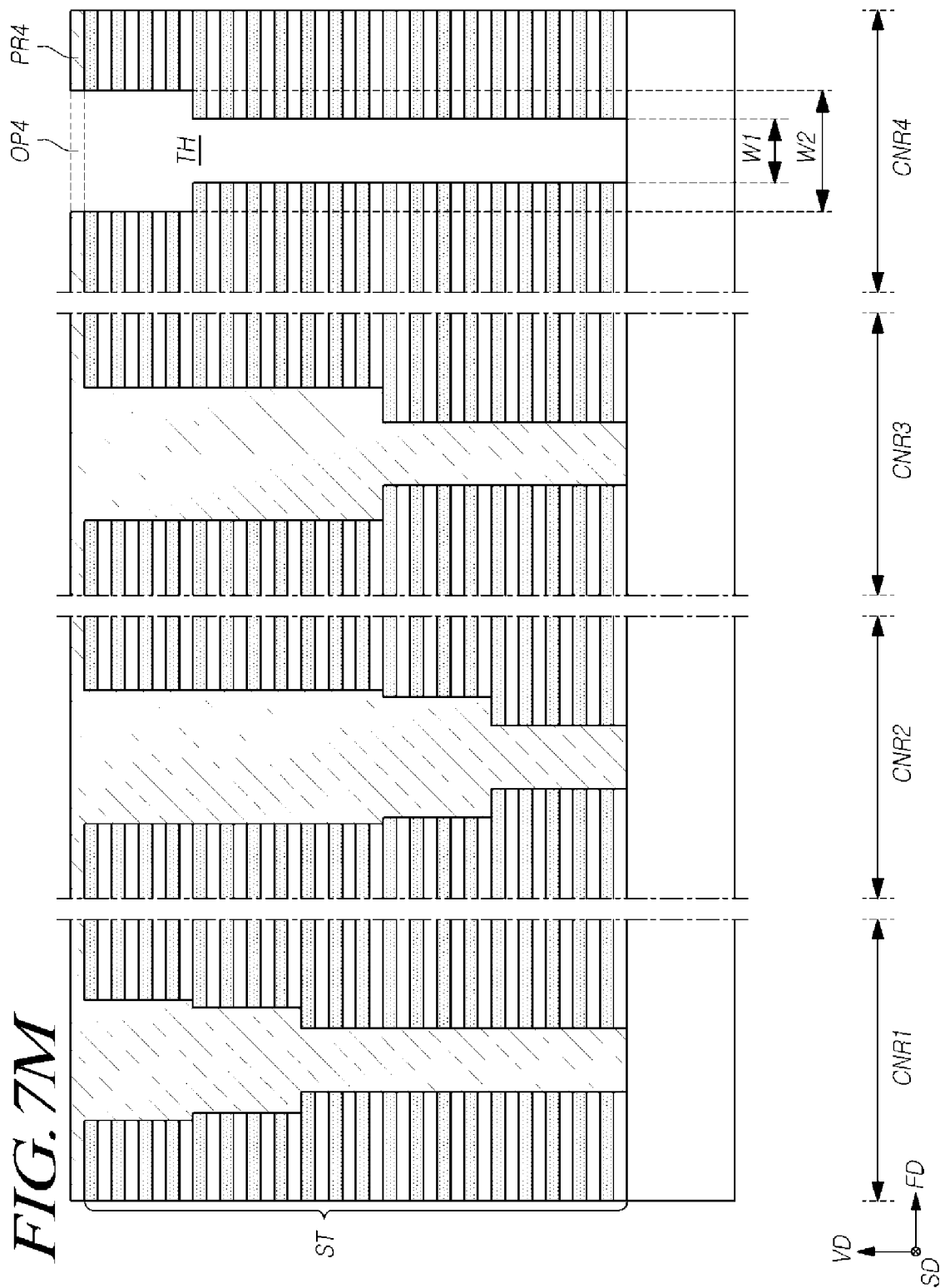

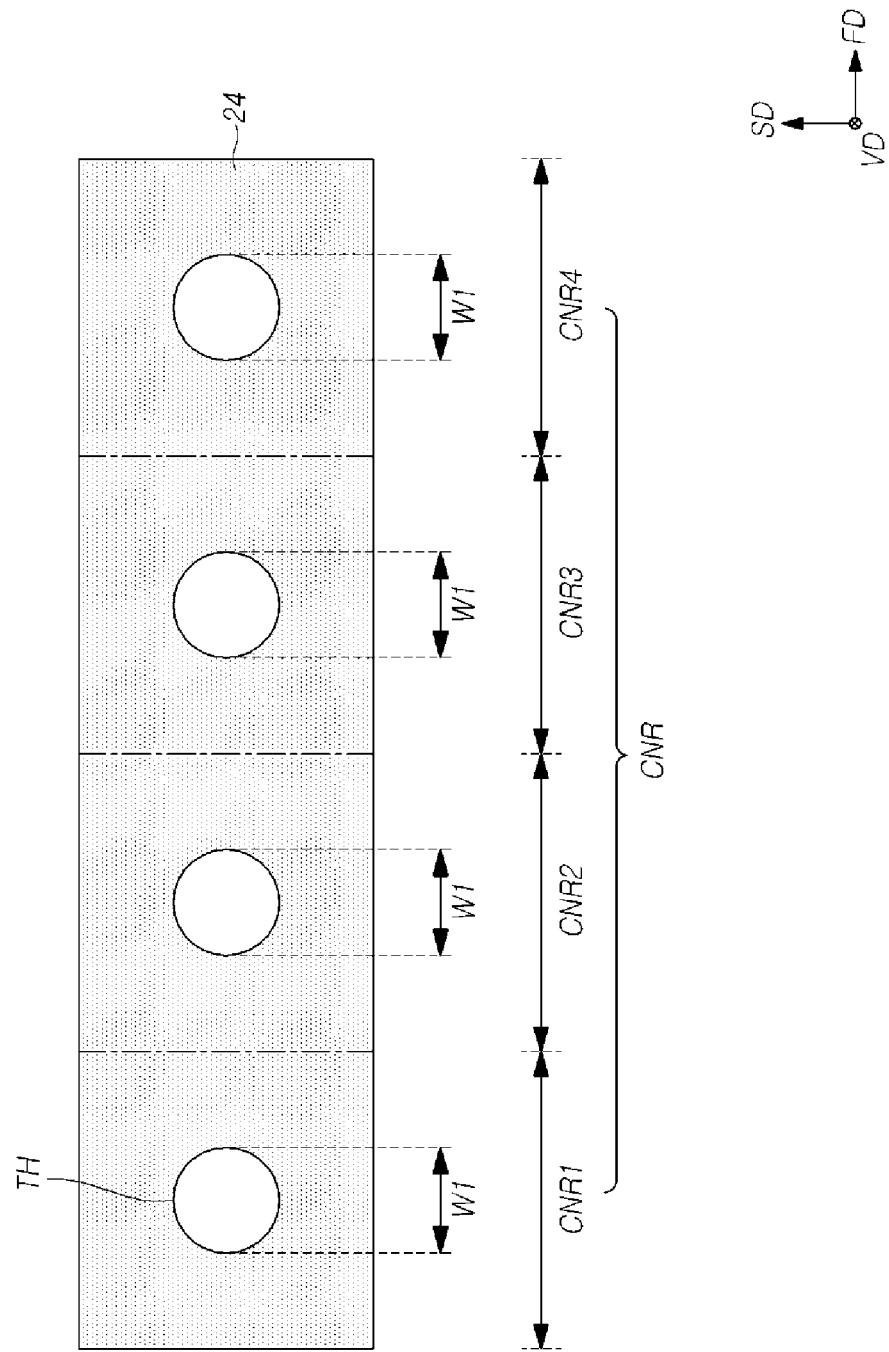

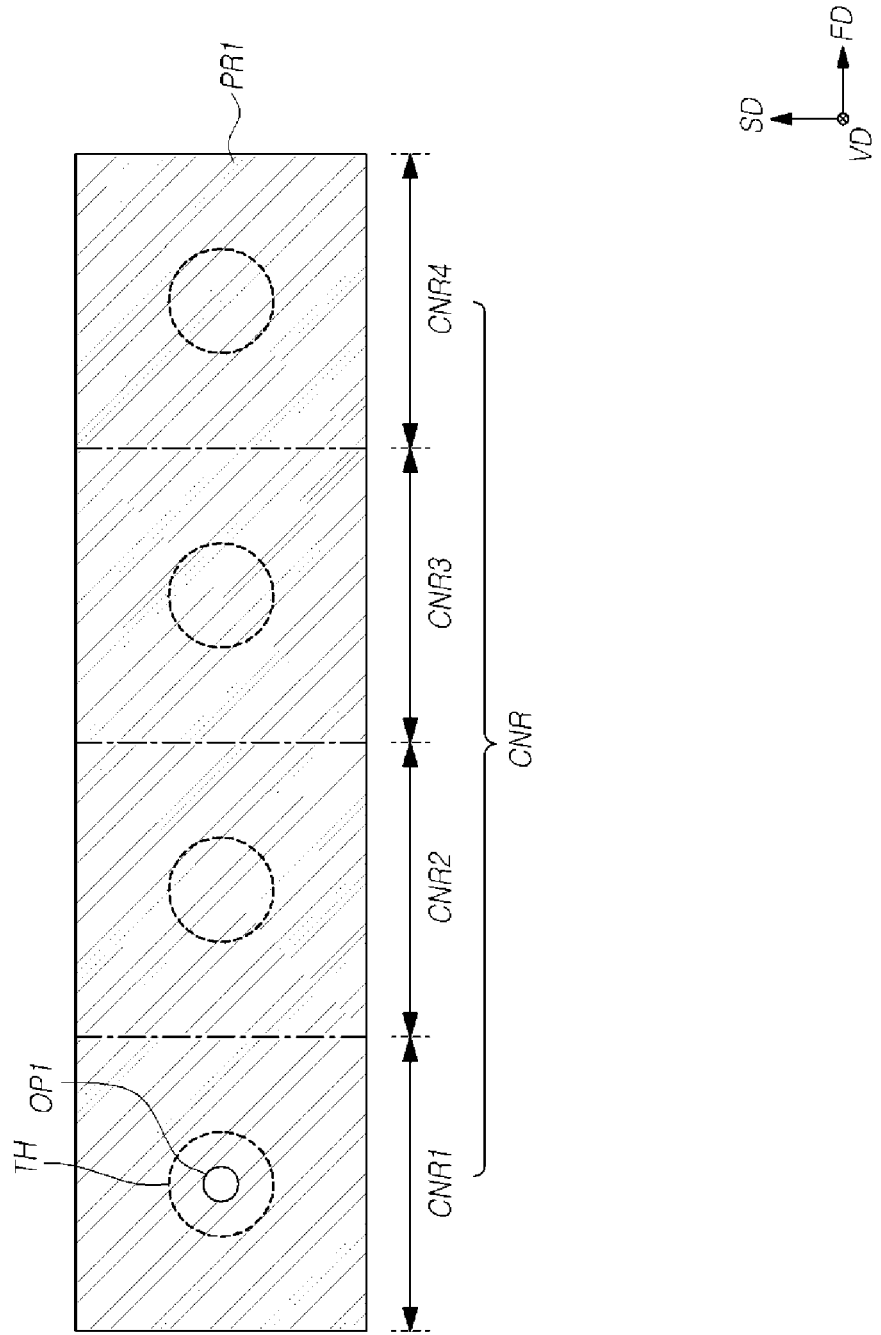

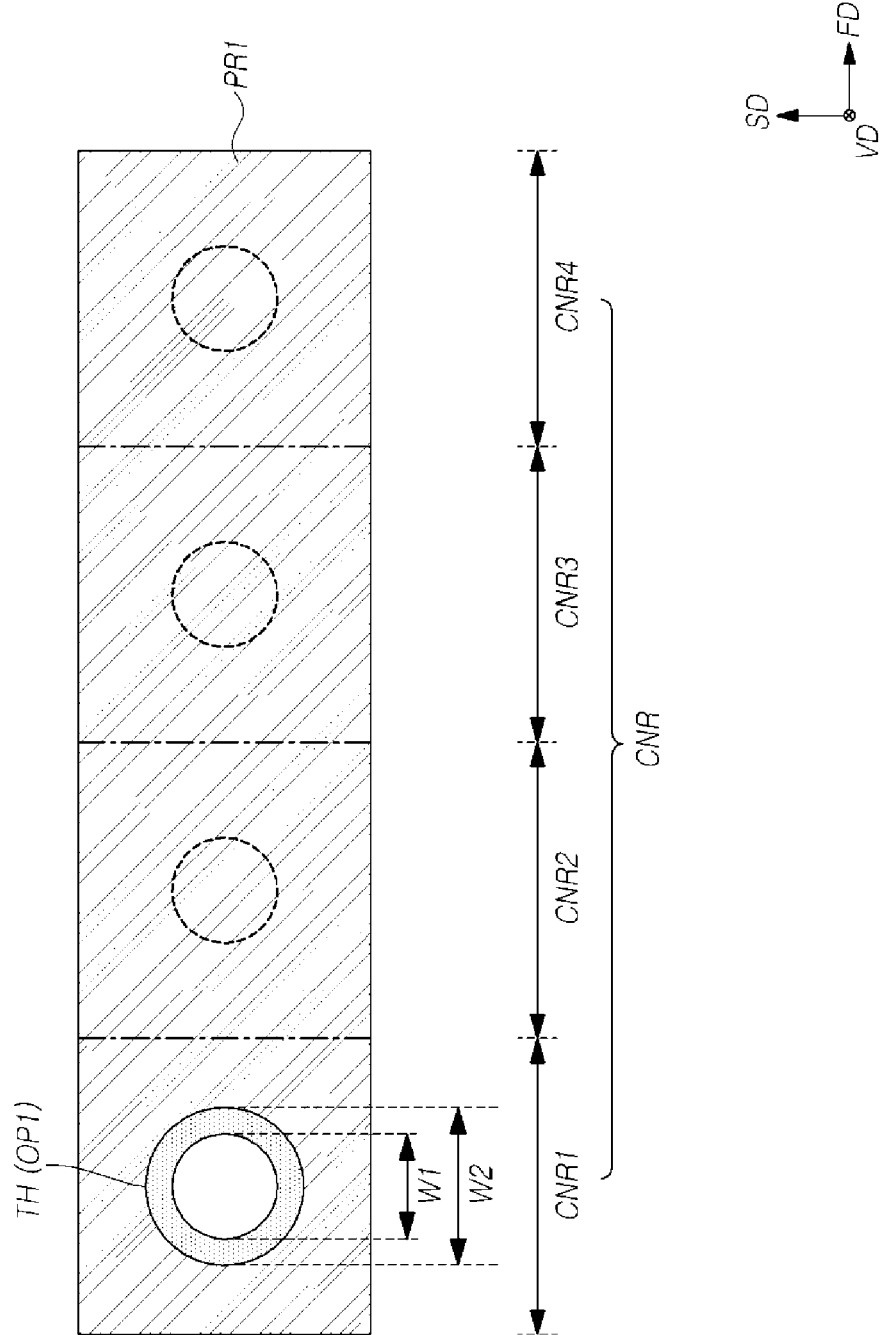

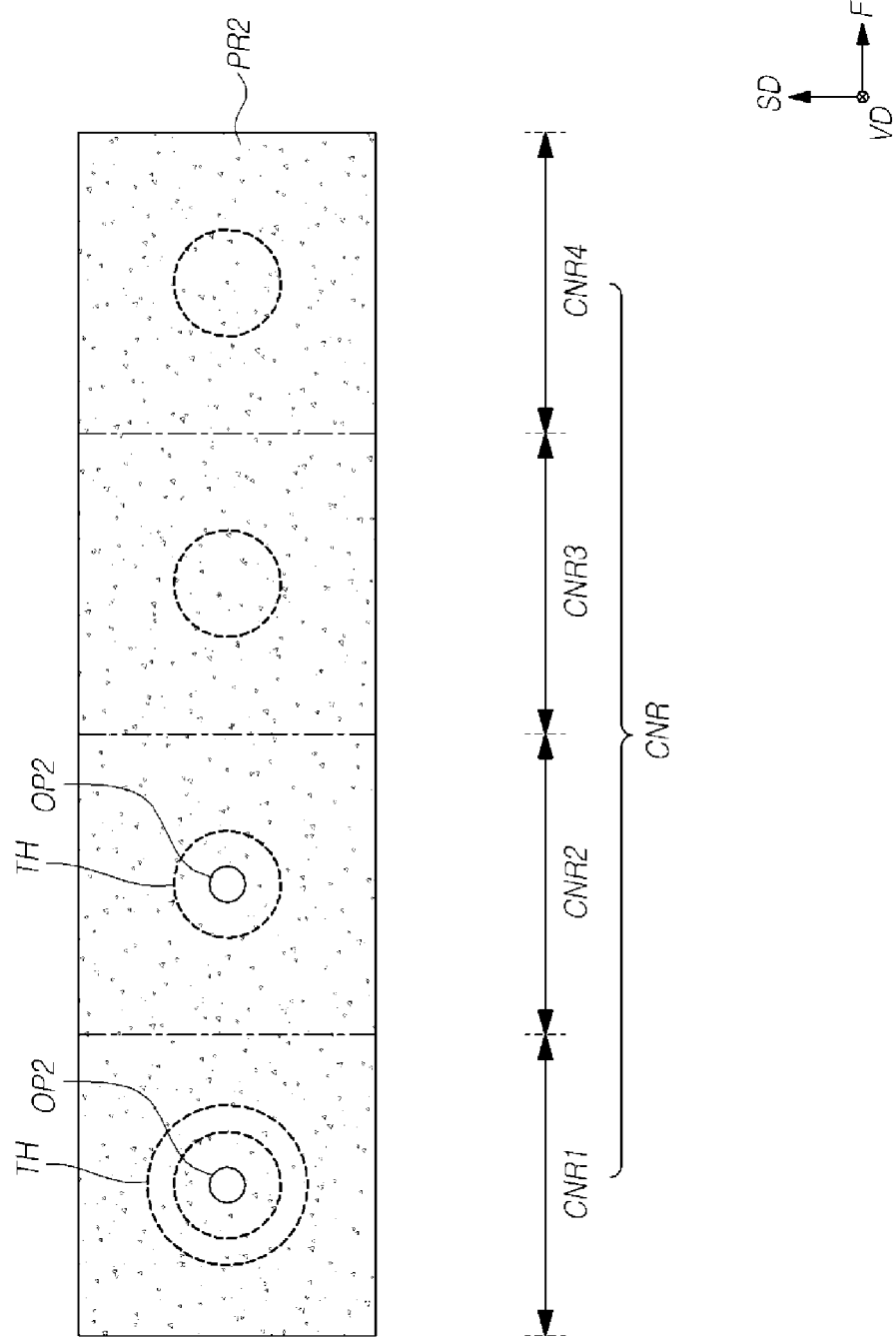

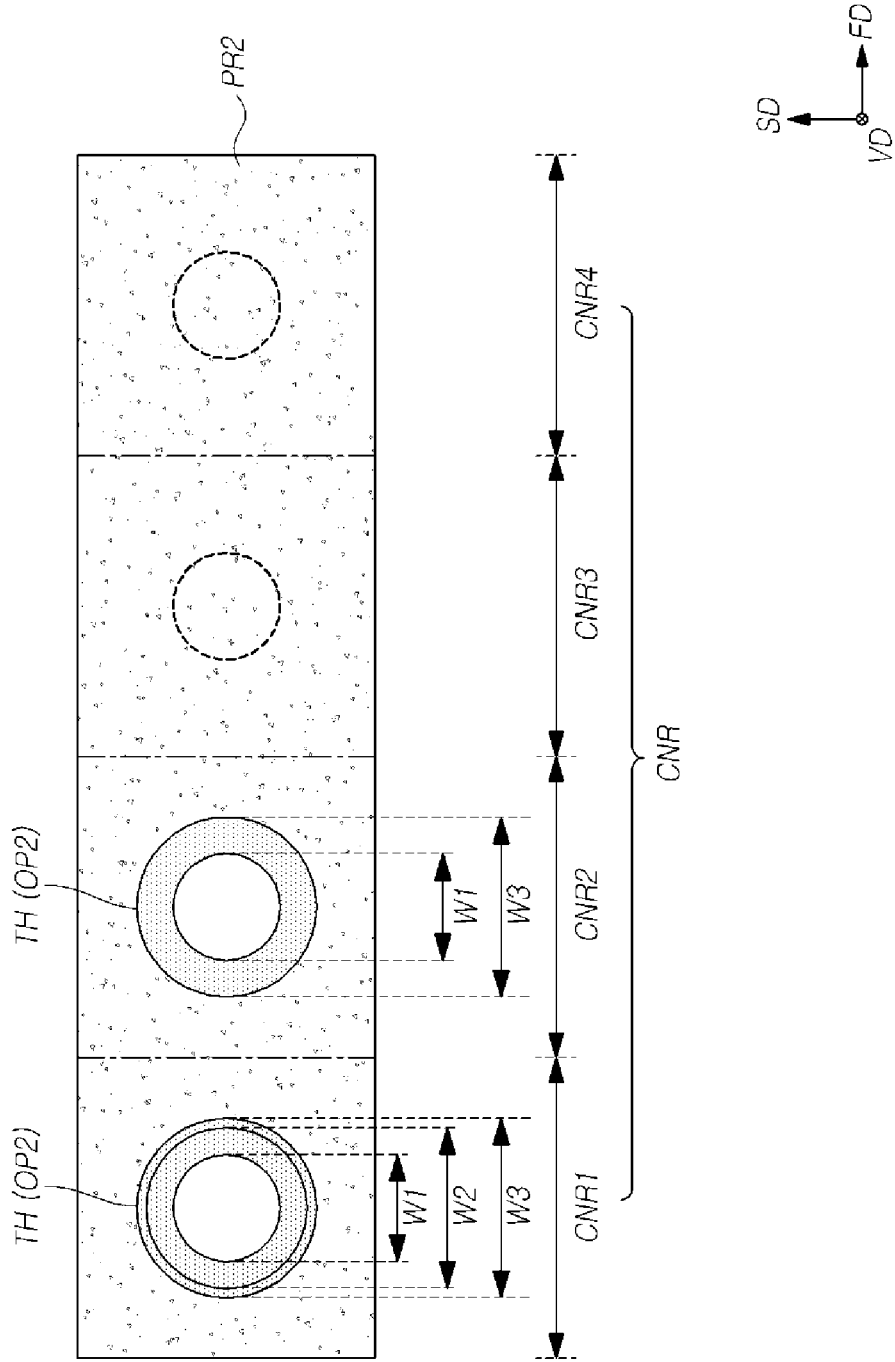

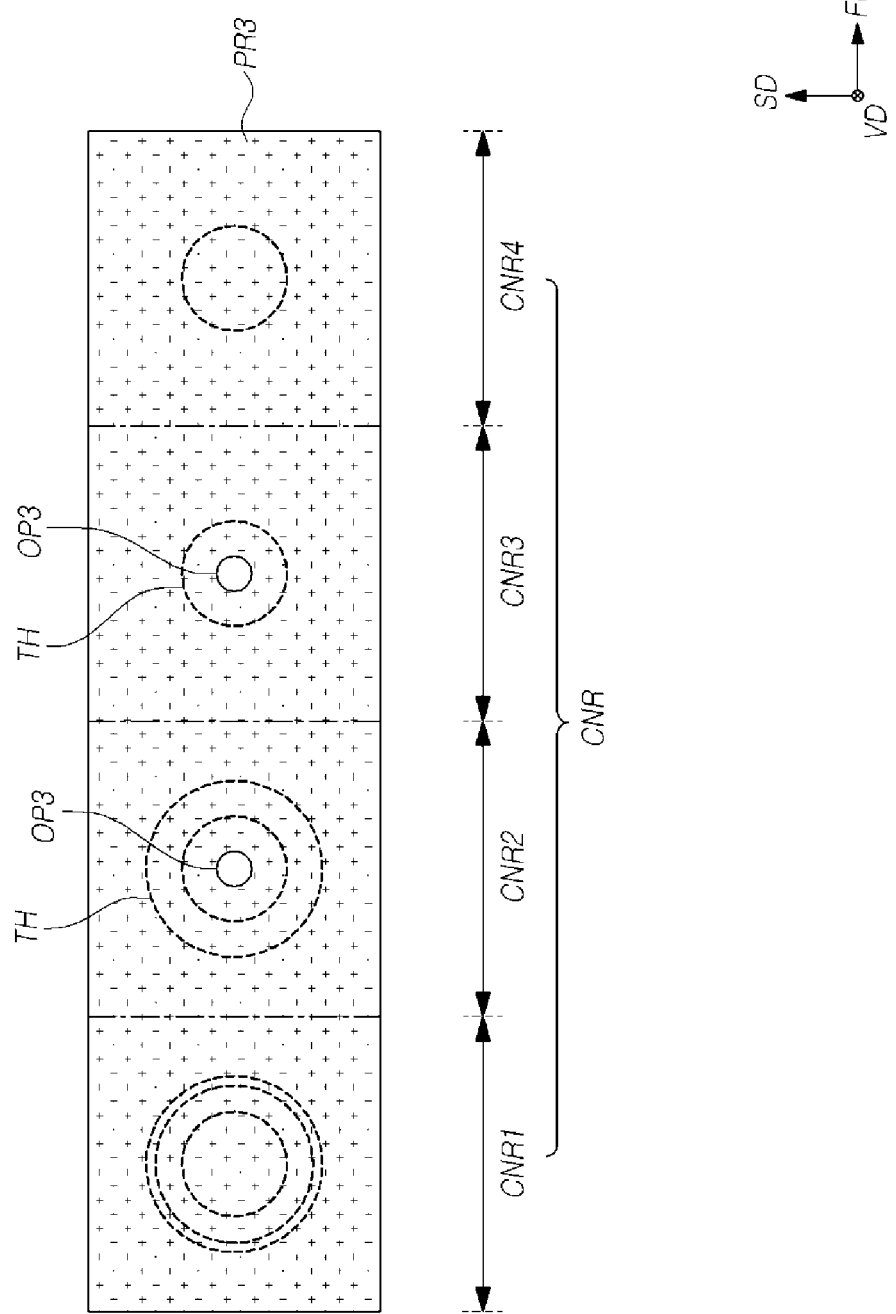

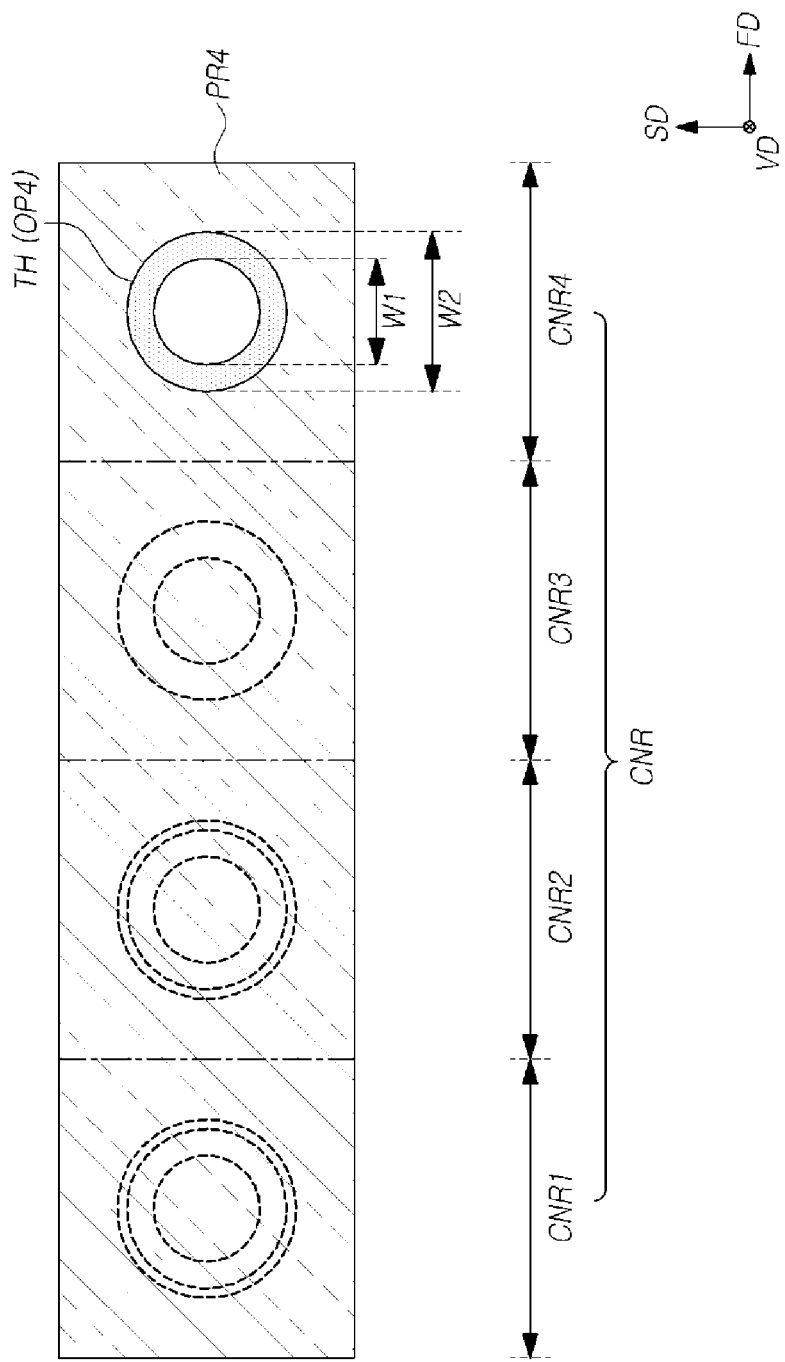

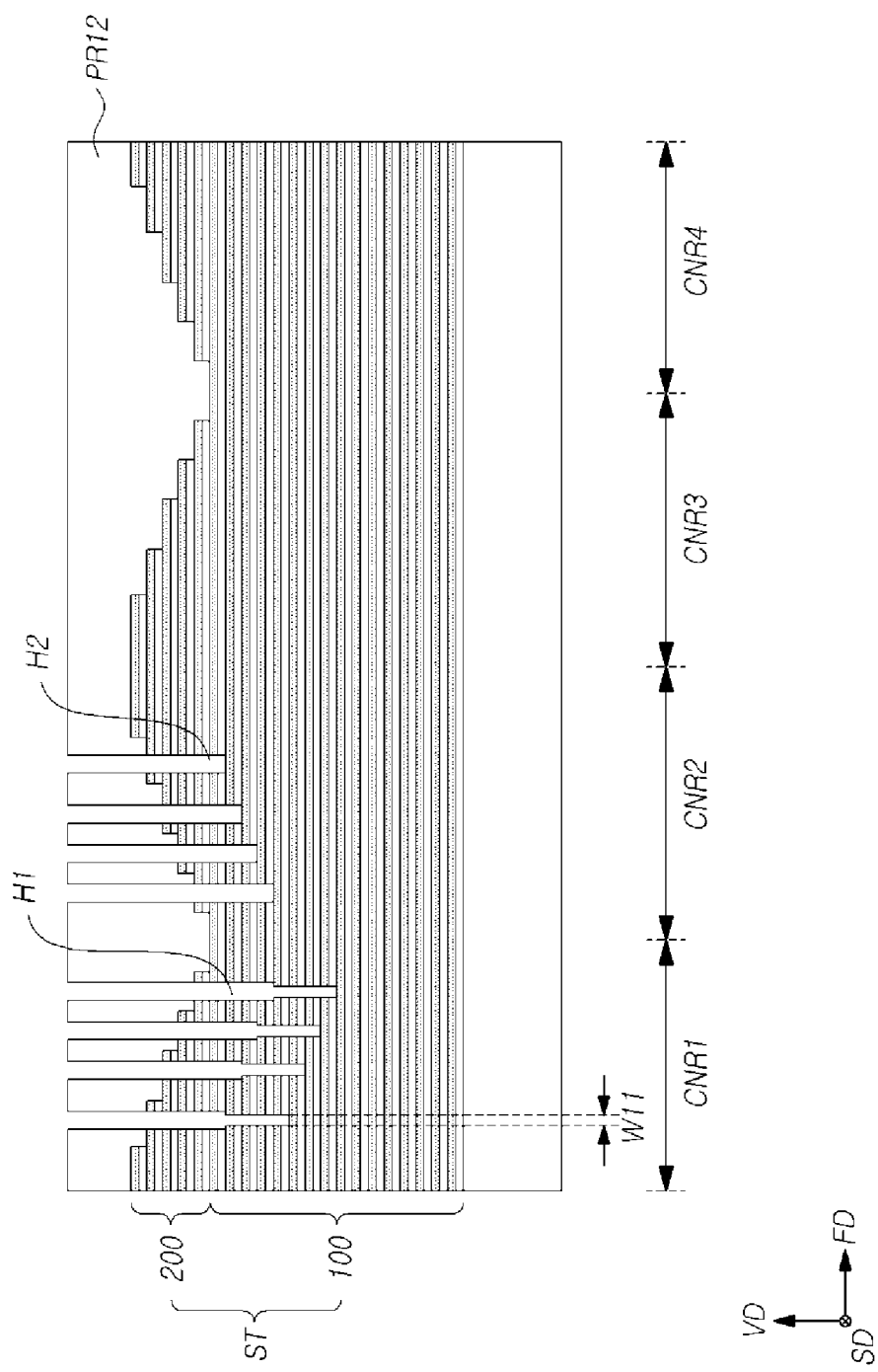

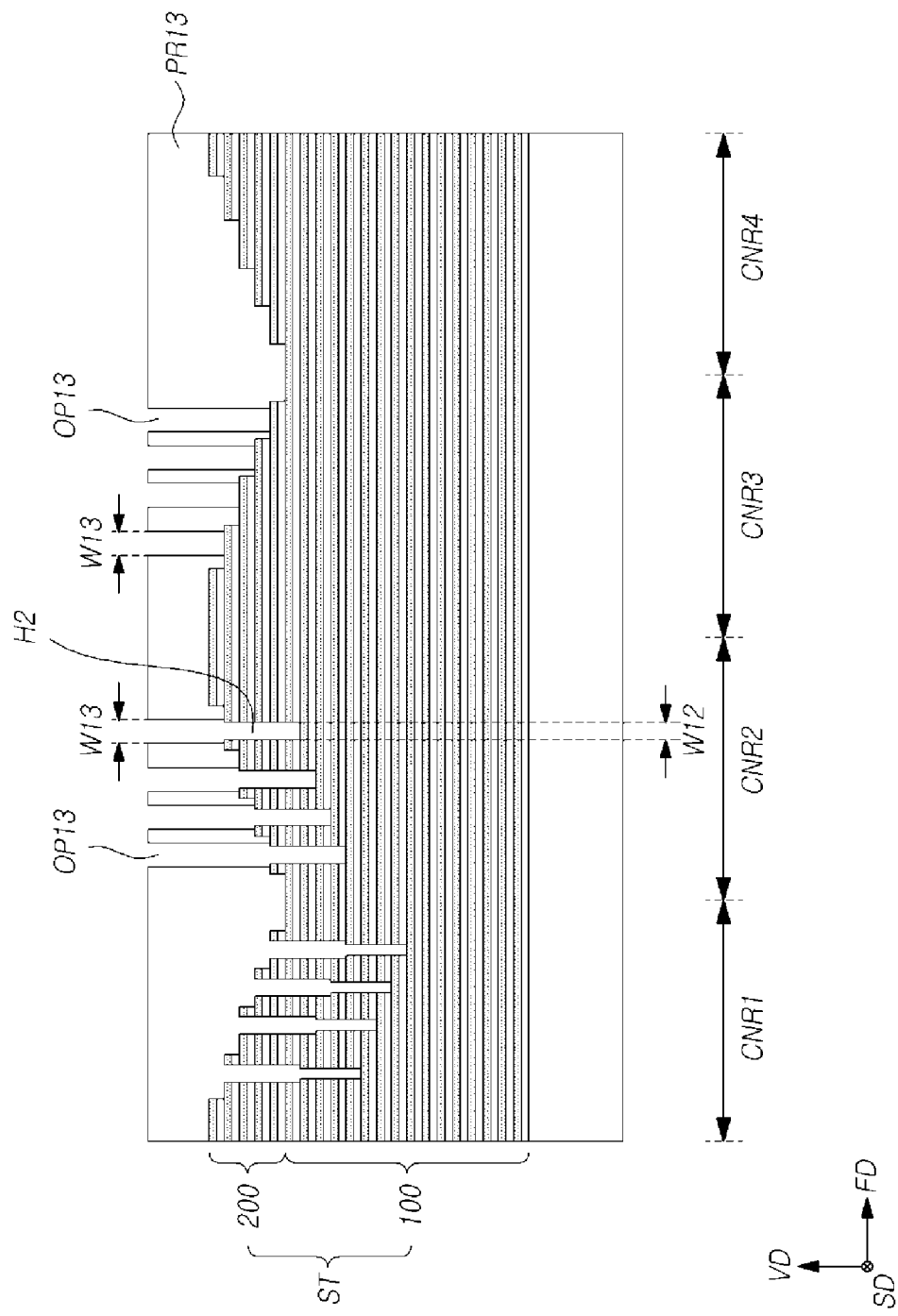

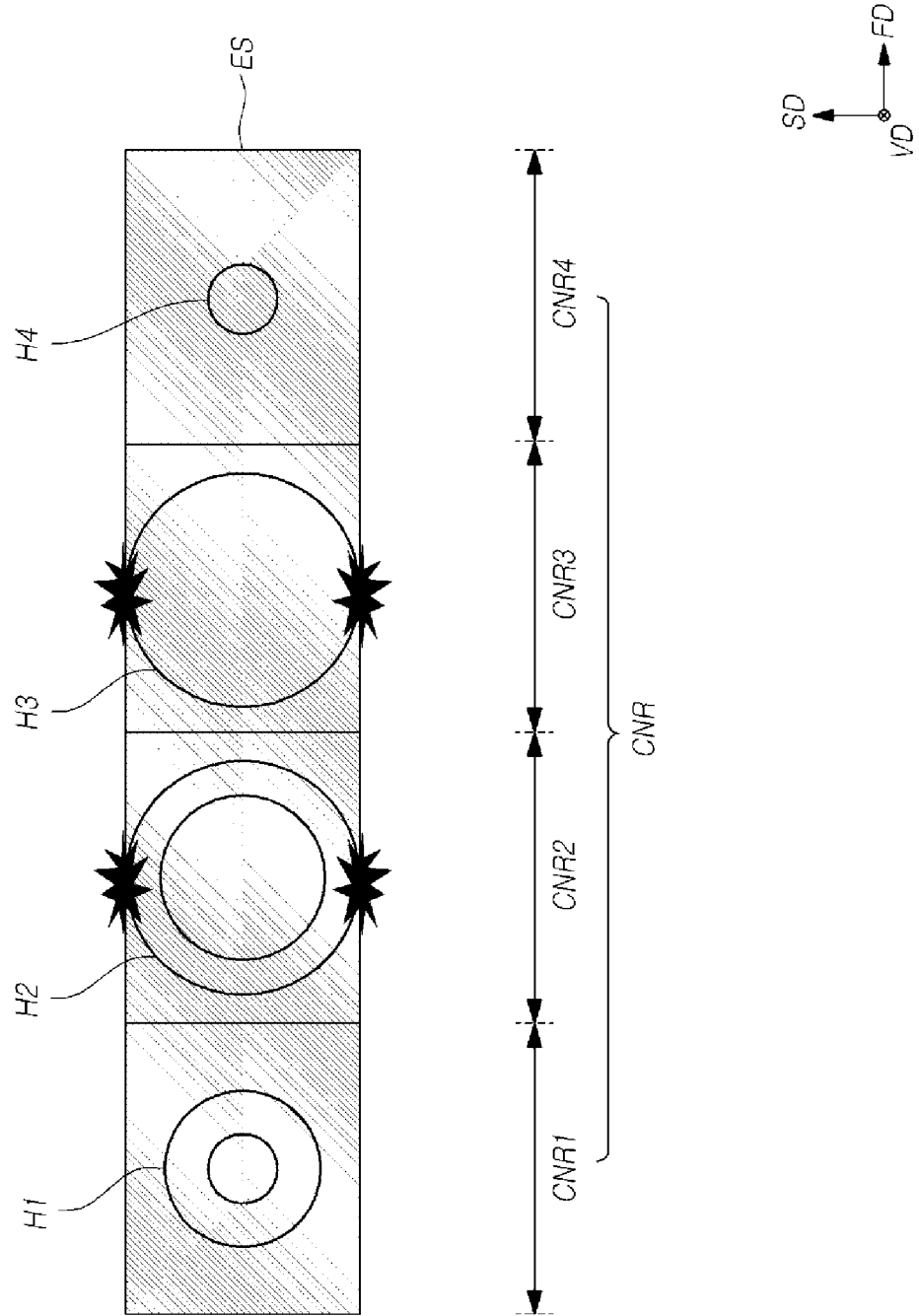

THREE-DIMENSIONAL MEMORY DEVICE AND MANUFACTURING METHOD THEREOF

CROSS-REFERENCE TO RELATED APPLICATION

The present application claims priority under 35 U.S.C. § 119(a) to Korean Patent Application No. 10-2021-0142597 filed in the Korean Intellectual Property Office on Oct. 25, 2021, which is incorporated herein by reference in its entirety.

BACKGROUND

1. Technical Field

Various embodiments generally relate to a semiconductor technology, and particularly, to a three-dimensional memory device and a method of manufacturing a three-dimensional memory device.

2. Related Art

A memory device with a two-dimensional or planar structure has been developed to store more data in the same area by using a fine patterning process. However, as the line width of a circuit is narrowed due to the demand for high integration, interference between memory cells increases and causes various limitations such as degradation in performance. In addition to such structural limitations, an increase in manufacturing cost is inevitable because of expensive equipment that is required to pattern increasingly narrow fine lines.

To overcome such limitations of the two-dimensional memory devices, an alternative to a three-dimensional memory device has been proposed. A three-dimensional memory device has advantages in that a larger capacity may be realized within the same area by stacking memory cells in a vertical direction, thereby increasing the number of stacks through and providing high performance and excellent power efficiency.

In a three-dimensional memory device, the degree of integration may be increased by increasing the number of electrode layers (word lines) to be stacked. In order to independently apply electrical signals to the electrode layers, which are disposed at different heights in the stack, contacts need to be coupled to each of the electrode layers, and various technologies are being developed to this end.

SUMMARY

Various embodiments are directed to a three-dimensional memory device and a manufacturing method thereof, capable of preventing failures in which the electrode layers are disconnected due to wide contact holes.

In an embodiment, a method for manufacturing a three-dimensional memory device may include: forming a through hole that passes through a stack including a plurality of first material layers and a plurality of second material layers alternately stacked on a substrate in a vertical direction; forming a mask to fill the through hole and to cover the stack; forming an opening that passes vertically through the mask and that aligns with a center portion of the through hole; expanding, in a horizontal direction, the opening in the mask disposed on the stack to expose the through hole and a portion of a top surface of the stack around the through hole; and partially etching the stack exposed by the opening.

In an embodiment, a method for manufacturing a three-dimensional memory device may include: forming a first through hole and a second through hole that pass through a stack including a plurality of first material layers and a plurality of second material layers alternately stacked on a substrate in a vertical direction; forming a first mask that fills the first and second through holes and covers the stack; forming a first opening that passes through the first mask at a center portion of the first through hole; expanding the first opening in the first mask in a horizontal direction to expose the first through hole and a top surface of the stack around the first through hole; partially etching the stack exposed by the expanded first opening; forming a second mask that fills the first and second through holes and covers the stack; forming second openings that pass through the first mask at a center portion of the first through hole and a center portion of the second through hole, respectively; expanding the second openings in the second mask in the horizontal direction to expose the partially expanded first through hole and a top surface of the stack around the partially expanded first through hole and to expose the second through hole and a top surface of the stack around the second through hole; and partially etching the stack exposed by the expanded second openings.

In an embodiment, a three-dimensional memory device may include: an electrode structure including a plurality of electrode layers and a plurality of interlayer dielectric layers which are alternately stacked on a substrate in a vertical direction; and a plurality of through holes, passing through the electrode structure in the vertical direction, that each include at least a first portion and a second portion having a different width, and pad regions are disposed on a surface of an electrode layer at the top of the first portion.

BRIEF DESCRIPTION OF THE DRAWINGS

FIG. 1 is a view schematically illustrating a three-dimensional memory device in accordance with an embodiment of the present disclosure.

FIGS. 4A to 4D are enlarged top views illustrating first to fourth through holes of FIG. 2.

FIGS. 7A to 7M are cross-sectional views illustrating process steps for forming through holes of a three-dimensional memory device in accordance with an embodiment of the present disclosure.

FIGS. 8A to 8M are top views illustrating the process steps for forming the through holes of a three-dimensional memory device in accordance with an embodiment of the present disclosure.

FIGS. 9A to 9F are cross-sectional views illustrating process steps for manufacturing a three-dimensional memory device in a comparative example.

FIG. 10 is a top view illustrating through holes of the three-dimensional memory device in a comparative example.

DETAILED DESCRIPTION

Figure 2:
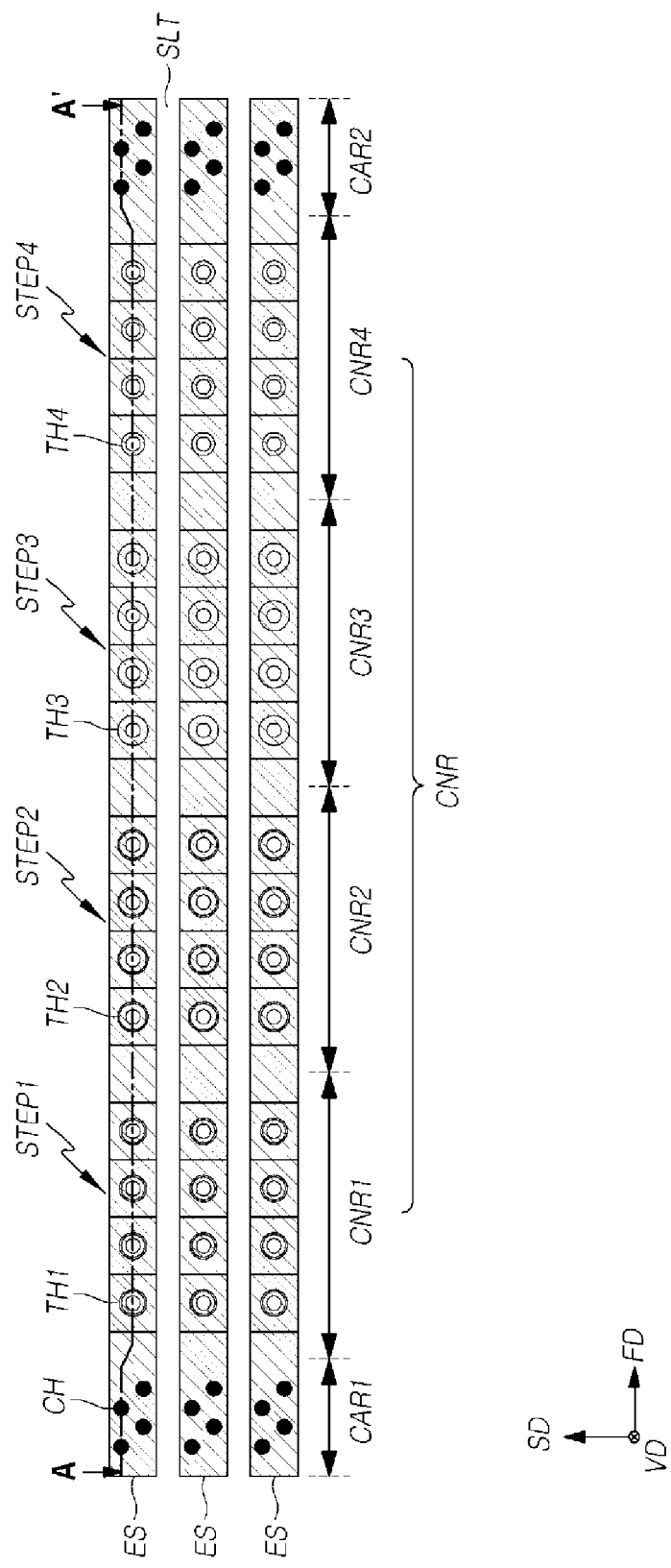
FIG. 2 is a top view illustrating a part of a three-dimensional memory device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of bit lines and the arrangement direction of word lines, and the second direction SD may be the extending direction of the word lines and the arrangement direction of the bit lines. The first direction FD and the second direction SD may substantially perpendicularly intersect with each other. In the drawings, a direction indicated by an arrow and a direction opposite thereto indicate the same direction.

Hereinafter, various examples of embodiments of the present disclosure will be described in detail with reference to the accompanying drawings.

FIG. 1 is a view schematically illustrating a three-dimensional memory device in accordance with an embodiment of the present disclosure.

Referring to FIG. 1, a three-dimensional memory device in accordance with an embodiment of the present disclosure may include a plurality of memory blocks BLK. The plurality of memory blocks BLK may be disposed in a first cell array region CAR1, a connection region CNR and a second cell array region CAR2. The first cell array region CAR1 and the second cell array region CAR2 may be disposed to be spaced apart from each other in a first direction FD, and the connection region CNR may be disposed between the first cell array region CAR1 and the second cell array region CAR2.

Although not illustrated, each memory block BLK may include an electrode structure including a plurality of electrode layers that are stacked in a vertical direction VD on a plane extending in the first direction FD and a second direction SD. Also, the memory block BLK may include a plurality of vertical channels that pass through the electrode structure in the vertical direction VD in the first cell array region CAR1 and the second cell array region CAR2. The electrode structure may be coupled with the plurality of vertical channels to configure a plurality of memory cells, which are three-dimensionally arranged.

Although not illustrated, contacts may be connected to the electrode layers of the memory blocks BLK in the connection region CNR. Each contact may be connected to a pad region of a corresponding electrode layer. Through holes are formed in the connection region CNR to expose the pad regions of the electrode layers, and the contacts in the through holes connect to the pad regions of the electrode layers.

Figure 3:
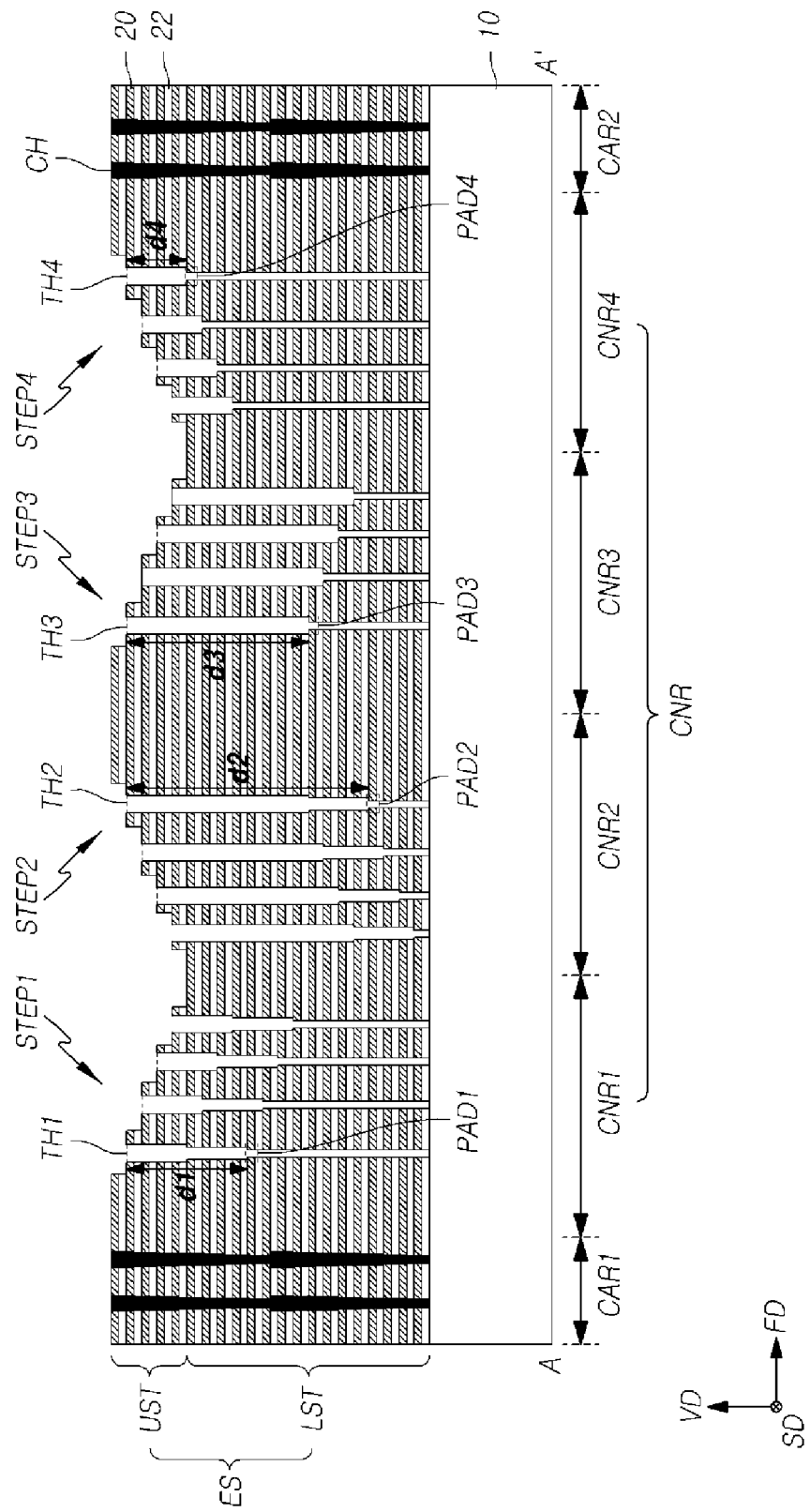
FIG. 3 is a cross-sectional view taken along the line A-A' of FIG. 2.

FIG. 2 is a top view illustrating a part of a three-dimensional memory device in accordance with an embodiment of the present disclosure, and FIG. 3 is a cross-sectional view taken along the line A-A' of FIG. 2.

Referring to FIG. 2, a plurality of electrode structures ES may be disposed in a first cell array region CAR1, a connection region CNR and a second cell array region CAR2. When viewed from the top, the electrode structures ES may extend in the first direction FD and may be arranged in the second direction SD. The electrode structures ES may be separated from each other by a slit SLT extending in the first direction FD to form adjacent electrode structures arranged in the second direction SD in a row-like manner.

The connection region CNR may be divided into a plurality of regions CNR1 to CNR4, which are arranged in the first direction FD between first cell array region CAR1 and second cell array region CAR2. The present embodiment illustrates that the connection region CNR is divided into four regions CNR1 to CNR4, but the disclosure is not limited to this example. For the sake of convenience in explanation, however, in the following description the regions CNR1 to CNR4 will be defined as first to fourth regions CNR1 to CNR4, respectively.

A first step structure STEP1 may be formed in the first region CNR1 of the electrode structure ES, and first through holes TH1 may be formed on step surfaces, respectively, of the first step structure STEP1. A second step structure STEP2 may be formed in the second region CNR2 of the electrode structure ES, and second through holes TH2 may be formed on step surfaces, respectively, of the second step structure STEP2. A third step structure STEP3 may be formed in the third region CNR3 of the electrode structure ES, and third through holes TH3 may be formed on step surfaces, respectively, of the third step structure STEP3. A fourth step structure STEP4 may be formed in the fourth region CNR4 of the electrode structure ES, and fourth through holes TH4 may be formed on step surfaces, respectively, of the fourth step structure STEP4.

A plurality of vertical channels CH, which extend in the vertical direction VD, may be formed in the first cell array region CAR1 and the second cell array region CAR2 of the electrode structure ES. In each electrode structure ES, the vertical channels CH may be disposed in a plurality of channel rows. FIG. 2 exemplarily illustrates a case in which each electrode structure ES includes two channel rows, but embodiments of the disclosure are not limited to this configuration.

Referring to FIG. 3, the electrode structure ES may be disposed on a substrate 10.

For example, the substrate 10 may include at least one among silicon (Si), germanium (Ge), silicon germanium (SiGe), gallium arsenide (GaAs), indium gallium arsenide (InGaAs), aluminum gallium arsenide (AlGaAs) and a compound thereof. The substrate 10 may be a bulk silicon substrate, a silicon on insulator (SOI) substrate, a germanium substrate, a germanium on insulator (GOI) substrate, a silicon germanium substrate, or a substrate of an epitaxial thin film obtained by performing selective epitaxial growth (SEG).

The electrode structure ES may include a lower stack LST and an upper stack UST that is stacked on the lower stack LST. The lower stack LST and the upper stack UST may include a plurality of electrode layers 20 and a plurality of interlayer dielectric layers 22, which are alternately stacked.

The electrode layers 20 may include a conductive material, and the interlayer dielectric layers 22 may include a dielectric material. For example, the electrode layers 20 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The electrode layers 20 may configure row lines. From among the electrode layers 20 of the electrode structure ES, at least one electrode layer 20 from the lowermost electrode layer 20 may configure a source select line. From among the electrode layers 20 of the electrode structure ES, at least one electrode layer 20 from the uppermost electrode layer 20 may configure a drain select line. The electrode layers 20 between the source select line and the drain select line may configure word lines. The interlayer dielectric layers 22 may include silicon oxide.

The first step structure STEP1 may be formed in the first region CNR1 of the upper stack UST, and may have a shape that slopes downward in a direction moving away from the first cell array region CAR1 in the first direction FD. The second step structure STEP2 may be formed in the second region CNR2 of the upper stack UST, and may have a shape that slopes upward in a direction going away from the first cell array region CAR1 in the first direction FD. The first step structure STEP1 and the second step structure STEP2 may face each other in the first direction FD, and may have a symmetrical or substantially symmetrical structure.

The third step structure STEP3 may be formed in the third region CNR3 of the upper stack UST, and may have a shape that slopes upward in a direction moving away from the second cell array region CAR2 in the first direction FD. The fourth step structure STEP4 may be formed in the fourth region CNR4 of the upper stack UST, and may have a shape that slopes downward in the direction going away from the second cell array region CAR2 in the first direction FD. The third step structure STEP3 and the fourth step structure STEP4 may face each other in the first direction FD, and may have a symmetrical or substantially symmetrical structure.

The first step structure STEP1 includes step surfaces that may be formed in the first region CNR1 of the electrode structure ES. The step surfaces of the first region CNR1 may include the exposed upper surfaces of each electrode layer 20 in the first region CNR1. Due to the downward slope, the step surfaces are incrementally lower in the vertical direction VD and therefore closer to the top surface of the substrate 10 when moving in the first direction FD away from the first cell array region CAR1.

The first through holes TH1 may pass through the electrode structure ES from the step surfaces of the first region CNR1 in the vertical direction VD to extend to the substrate 10. A pad region PAD1 of a corresponding electrode layer 20 may be positioned on the sidewall or a shoulder of each of the first through holes TH1. Hereinafter, the pad region PAD1 positioned on the shoulder of the first through hole TH1 will be defined as a first pad region PAD1.

Within the first through holes TH1, first pad regions PAD1 may be positioned at a first depth d1, as measured in the vertical direction VD from the top of each of the step surfaces, respectively. The first pad regions PAD1 may be simultaneously formed by exposing an electrode layer at the first depth d1 through the same recess etching process used to form the first through holes TH1. Thus, the first depth d1 may correspond to an etch depth of the recess etching process for exposing the first pad regions PAD1. The shoulder may be formed at first depth d1 within the through hole TH1.

The first pad regions PAD1 of the electrode layers 20 may be positioned at different heights from the top surface of the substrate 10 because the step surfaces of the first region CNR1 are positioned at different heights from the top surface of the substrate 10, and because the first pad regions PAD1 are positioned at the same depth d1 from the top of the step surfaces in the vertical direction VD. The first pad regions PAD1 may be incrementally closer to the top surface of the substrate 10 when going in the first direction FD away from the first cell array region CAR1.

The second step structure STEP2 includes step surfaces that may be formed in the second region CNR2 of the electrode structure ES. The step surfaces of the second region CNR2 may include the exposed upper surfaces of each electrode layer 20 in the second region CNR2. Due to the upward slope, the step surfaces are incrementally higher in the vertical direction VD and therefore farther from the top surface of the substrate 10 when moving in the first direction FD away from the first cell array region CAR1.

The second through holes TH2 may pass through the electrode structure ES from the step surfaces of the second region CNR2 in the vertical direction VD to extend to the substrate 10. A pad region PAD2 of a corresponding electrode layer 20 may be positioned on the sidewall or a shoulder of each of the second through holes TH2. Hereinafter, the pad region PAD2 positioned on the shoulder of the second through hole TH2 will be defined as a second pad region PAD2.

Within the second through holes TH2, second pad regions PAD2 may be positioned at the same second depth d2, as measured in the vertical direction VD from the top of each of the step surfaces, respectively. In an example, the second depth d2 may be greater than the first depth d1. The second pad regions PAD2 may be simultaneously formed by exposing an electrode layer at the second depth d2 through the same recess etching process used to form the second through holes TH2. Thus, the second depth d2 may correspond to an etch depth of the recess etching process for exposing the second pad regions PAD2. The shoulder may be formed at second depth d2 within the through hole TH2.

The second pad regions PAD2 of the electrode layers 20 in the second region CNR2 may be positioned at different heights from the top surface of the substrate 10 because the step surfaces are positioned at different heights from the top surface of the substrate 10, and because the second pad regions PAD2 are positioned at the same depth d2 from the top of the step surfaces in the vertical direction VD. The second pad regions PAD2 may be incrementally farther from the top surface of the substrate 10 when going in the first direction FD away from the first cell array region CAR1.

The third step structure STEP3 includes step surfaces that may be formed in the third region CNR3 of the electrode structure ES. The step surfaces of the third region CNR3 may include the exposed upper surfaces of each electrode layer 20 in the third region CNR3. Due to the upward slope, the step surfaces are incrementally higher in the vertical direction VD and therefore farther from the top surface of the substrate 10 when moving in the first direction FD away from the second cell array region CAR2.

The third through holes TH3 may pass through the electrode structure ES from the step surfaces of the third region CNR3 in the vertical direction VD to extend to the substrate 10. A pad region PAD3 of a corresponding electrode layer 20 may be positioned on the sidewall or a shoulder of each of the third through holes TH3. Hereinafter, the pad region PAD3 positioned on the shoulder of the third through hole TH3 will be defined as a third pad region PAD3.

Within the third through holes TH3, third pad regions PAD3 may be positioned at the same third depth d3, as measured in the vertical direction VD from the top of each of the step surfaces, respectively. In an example, the third depth d3 may be greater than the first depth d1, and may be smaller than the second depth d2. The third pad regions PAD3 may be simultaneously formed by exposing an electrode layer at the third depth d3 through the same recess etching process used to form the third through holes TH3. Thus, the third depth d3 may correspond to an etch depth of the recess etching process for exposing the third pad regions PAD3. The shoulder may be formed at third depth d3 within the through hole TH3.

The third pad regions PAD3 of the electrode layers 20 in the third region CNR3 may be positioned at different heights from the top surface of the substrate 10 because the step surfaces are positioned at different heights from the top surface of the substrate 10, and because the third pad regions PAD3 are positioned at the same depth d3 from the top of the step surfaces in the vertical direction VD. The third pad regions PAD3 may be incrementally farther from the top surface of the substrate 10 when going in the first direction FD away from the second cell array region CAR2.

The fourth step structure STEP4 includes step surfaces that may be formed in the fourth region CNR4 of the electrode structure ES. The step surfaces of the fourth region CNR4 may include the exposed upper surfaces of each electrode layer 20 in the fourth region CNR4. Due to the downward slope, the step surfaces are incrementally lower in the vertical direction VD and therefore closer to the top surface of the substrate 10 when moving in the first direction FD away from the second cell array region CAR2.

The fourth through holes TH4 may pass through the electrode structure ES from the step surfaces of the fourth region CNR4 in the vertical direction VD to extend to the substrate 10. A pad region PAD4 of a corresponding electrode layer 20 may be positioned on the sidewall or a shoulder of each of the fourth through holes TH4. Hereinafter, the pad region PAD4 positioned on the shoulder of the fourth through hole TH4 will be defined as a fourth pad region PAD4.

Within the fourth through holes TH4, fourth pad regions PAD4 may be positioned at a fourth depth d4, as measured in the vertical direction VD from the top of each of the step surfaces, respectively. In an example, the fourth depth d4 may be smaller than the first depth d1. The fourth pad regions PAD4 may be simultaneously formed by exposing an electrode layer at the fourth depth d4 through the same recess etching process used to form the fourth through holes TH4. Thus, the fourth depth d4 may correspond to an etch depth of the recess etching process for exposing the fourth pad regions PAD4. The shoulder may be formed at fourth depth d4 within the through hole TH4.

The fourth pad regions PAD4 of the electrode layers 20 may be positioned at different heights from the top surface of the substrate 10 because the step surfaces of the fourth region CNR4 are positioned at different heights from the top surface of the substrate 10, and because the fourth pad regions PAD4 are positioned at the same depth d4 from the top of the step surfaces in the vertical direction VD. The fourth pad regions PAD4 may be incrementally closer to the top surface of the substrate 10 when moving in the first direction FD away from the second cell array region CAR2.

The vertical channels CH may pass through the electrode structure ES to extend to the substrate 10 in the vertical direction VD in the first cell array region CAR1 and the second cell array region CAR2.

Although not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where a source select line surrounds a vertical channel CH. Memory cells may be configured in areas or regions where the word lines surround the vertical channel CH. A drain select transistor may be configured in areas or regions where a drain select line surrounds a vertical channel CH. The source select transistor, the plurality of memory cells and the drain select transistor disposed along one vertical channel CH may configure one cell string. Although not illustrated, each of the vertical channels CH may be connected to a corresponding bit line through a bit line contact.

FIGS. 4A to 4D are enlarged top views illustrating first to fourth through holes of FIG. 2, and FIGS. 5A to 5D are enlarged cross-sectional views illustrating the first to fourth through holes of FIG. 3.

Figure 4A:
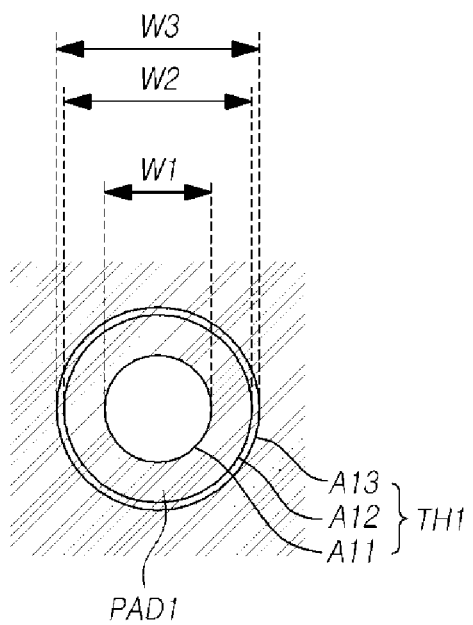
Figure 5A:
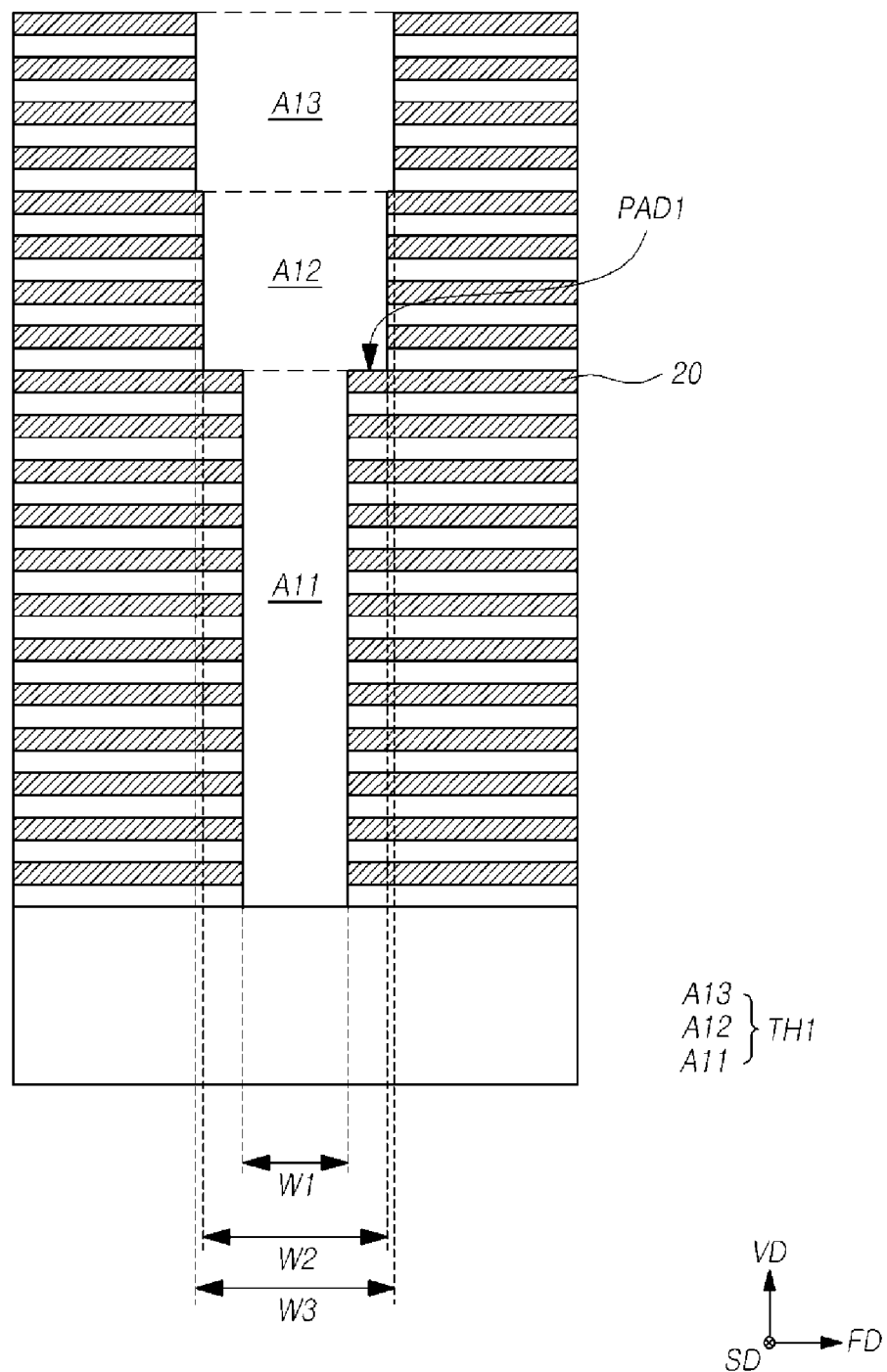
FIGS. 5A to 5D are enlarged cross-sectional views illustrating the first to fourth through holes of FIG. 3.

Referring to FIGS. 4A and 5A, the first through hole TH1 may include a first portion A11, a second portion A12 that is positioned on the first portion A11 and communicates with the first portion A11, and a third portion A13 that is positioned on the second portion A12 and communicates with the second portion A12. In FIG. 4A, the first portion A11, the second portion A12 and the third portion A13 may be centered on each other.

The width of the first portion A11 of the first through hole TH1 may have a size of W1, the width of the second portion A12 of the first through hole TH1 may have a size of W2 larger than W1, and the width of the third portion A13 of the first through hole TH1 may have a size of W3 larger than W2. The difference between W3 and W2 may be smaller than the difference between W2 and W1.

Due to the difference in size between the width W2 of the second portion A12 of the first through hole TH1 and the width W1 of the first portion A11 of the first through hole TH1, the first pad region PAD1 of the electrode layer 20 corresponding to the first through hole TH1 may be exposed, as illustrated in FIG. 5A. The first pad region PAD1 is positioned at the lower end of the second portion A12 of the first through hole TH1, and when viewed from the top, may have a shape that surrounds the periphery of the first portion A11 of the first through hole TH1.

Figure 4B:
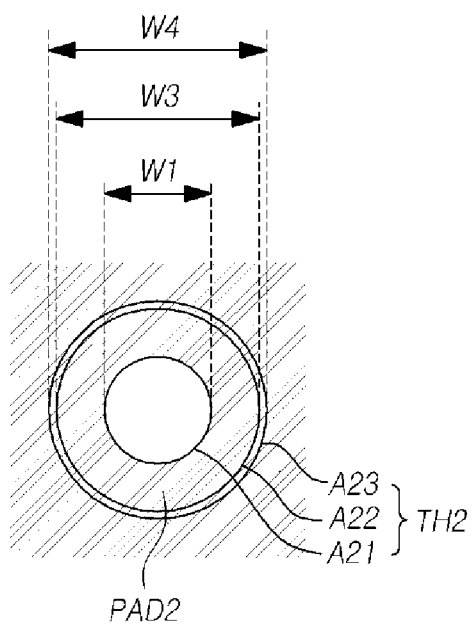
Figure 5B:
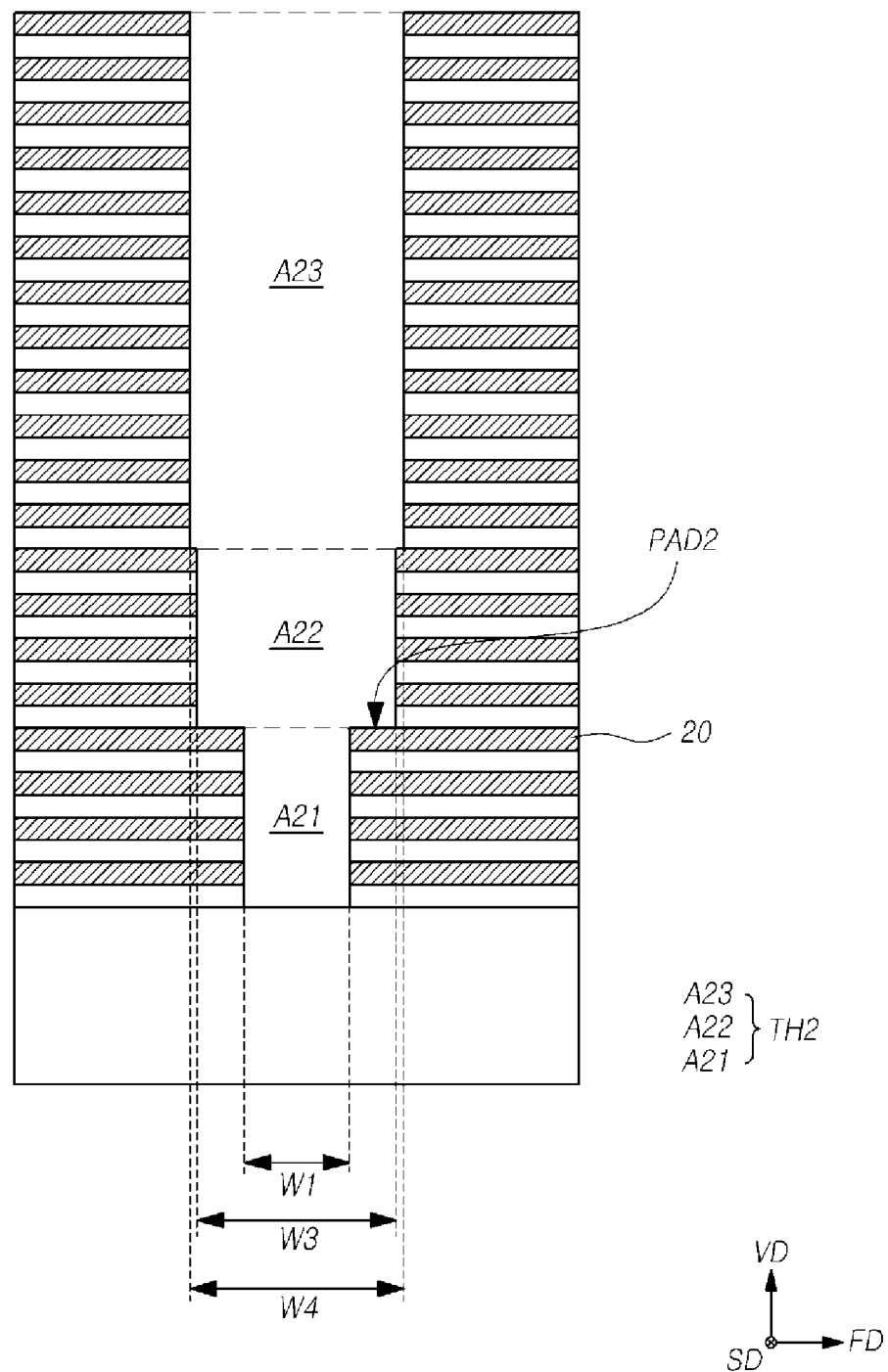

Referring to FIGS. 4B and 5B, the second through hole TH2 may include a first portion A21, a second portion A22 that is positioned on the first portion A21 and communicates with the first portion A21, and a third portion A23 that is positioned on the second portion A22 and communicates with the second portion A22.

The width of the first portion A21 of the second through hole TH2 may have the same size as the width of the first portion A11 of the first through hole TH1, and the width of the second portion A22 of the second through hole TH2 may have the same size as the width of the third portion A13 of the first through hole TH1. Thus, when the width of the first portion A11 of the first through hole TH1 is W1 and the width of the third portion A13 of the first through hole TH1 is W3, the width of the first portion A21 of the second through hole TH2 may be W1, and the width of the second portion A22 of the second through hole TH2 may be W3. The thickness, as measured in the vertical direction VD, of the second portion A22 of the second through hole TH2 and the thickness of the third portion A13 of the first through hole TH1 may be the same as each other. For example, the thickness of the second portion A22 of the second through hole TH2 and the thickness of the third portion A13 of the first through hole TH1 may have a size corresponding to four times the vertical pitch of the electrode layers 20. The vertical pitch of the electrode layers 20 means the vertical distance between the top surfaces of the electrode layers 20 which are adjacent to each other in the vertical direction VD. The width of the third portion A23 of the second through hole TH2 may have a size of W4, which is greater than W3. The difference between W4 and W3 is smaller than the difference between W3 and W1.

Due to the difference in size between the width W3 of the second portion A22 of the second through hole TH2 and the width W1 of the first portion A21 of the second through hole TH2, the second pad region PAD2 of the electrode layer 20 corresponding to the second through hole TH2 may be exposed. The second pad region PAD2 is positioned at the lower end of the second portion A22 of the second through hole TH2, and when viewed from the top, may have a shape that surrounds the periphery of the first portion A21 of the second through hole TH2.

Figure 5C:
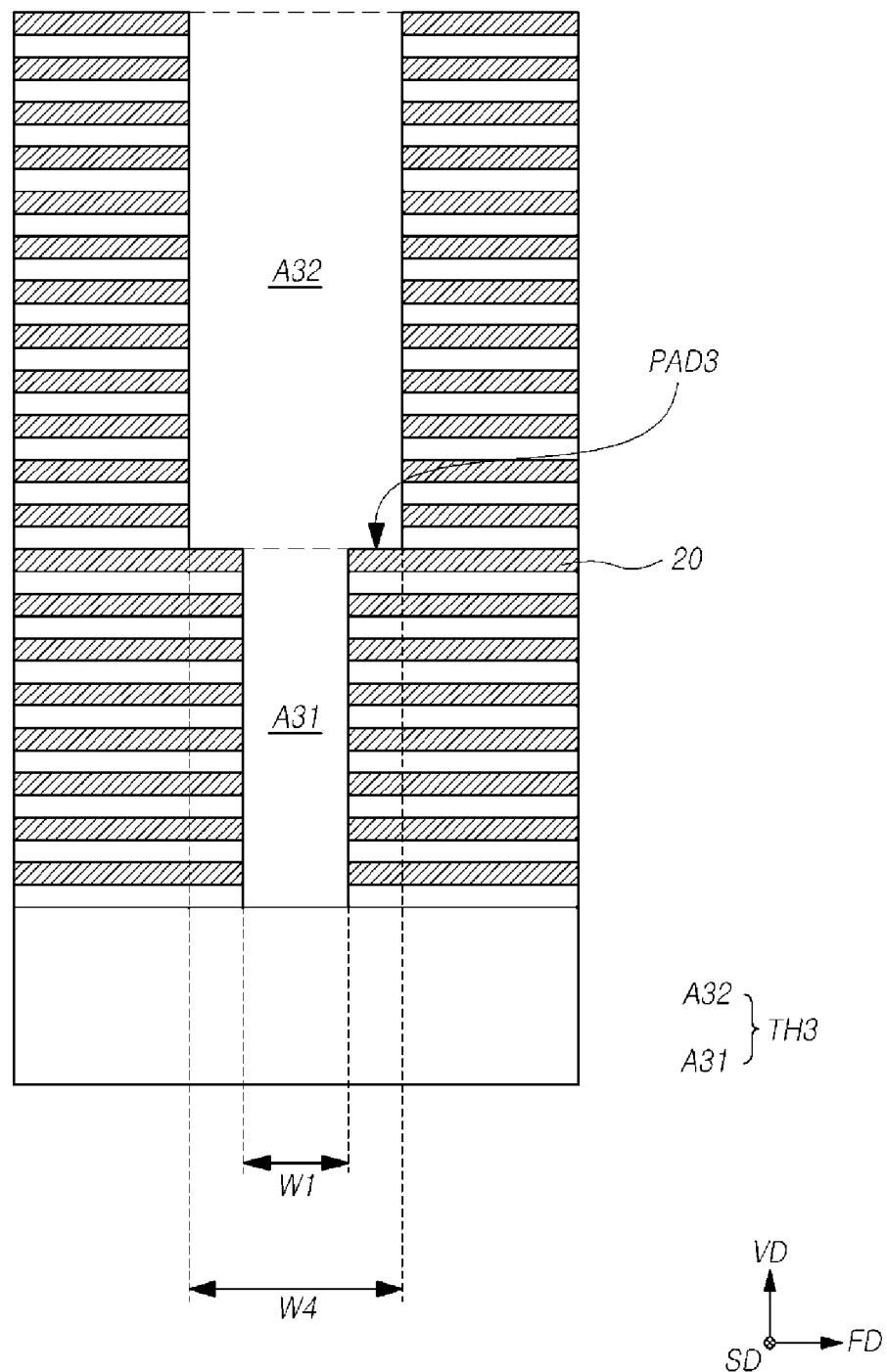

Referring to FIGS. 4C and 5C, the third through hole TH3 may include a first portion A31, and a second portion A32 which is positioned on the first portion A31 and communicates with the first portion A31.

The width of the first portion A31 of the third through hole TH3 may have the same size as the width of the first portion A11 of the first through hole TH1 and the width of the first portion A21 of the second through hole TH2. The width of the second portion A32 of the third through hole TH3 may have the same size as the width of the third portion A23 of the second through hole TH2. When the width of the first portion A11 of the first through hole TH1 and the width of the first portion A21 of the second through hole TH2 are W1, and the width of the third portion A23 of the second through hole TH2 is W4, the width of the first portion A31 of the third through hole TH3 may be W1, and the width of the second portion A32 of the third through hole TH3 may be W4. The thickness of the second portion A32 of the third through hole TH3 and the thickness of the third portion A23 of the second through hole TH2 may be the same. For example, the thickness of the second portion A32 of the third through hole TH3 and the thickness of the third portion A23 of the second through hole TH2 may have a size corresponding to twelve (12) times the vertical pitch of the electrode layers 20.

Due to the difference in size between the width W4 of the second portion A32 of the third through hole TH3 and the width W1 of the first portion A31 of the third through hole TH3, the third pad region PAD3 of the electrode layer 20 corresponding to the third through hole TH3 may be exposed. The third pad region PAD3 is positioned at the lower end of the second portion A32 of the third through hole TH3, and when viewed from the top, may have a shape that surrounds the periphery of the first portion A31 of the third through hole TH3.

Figure 5D:
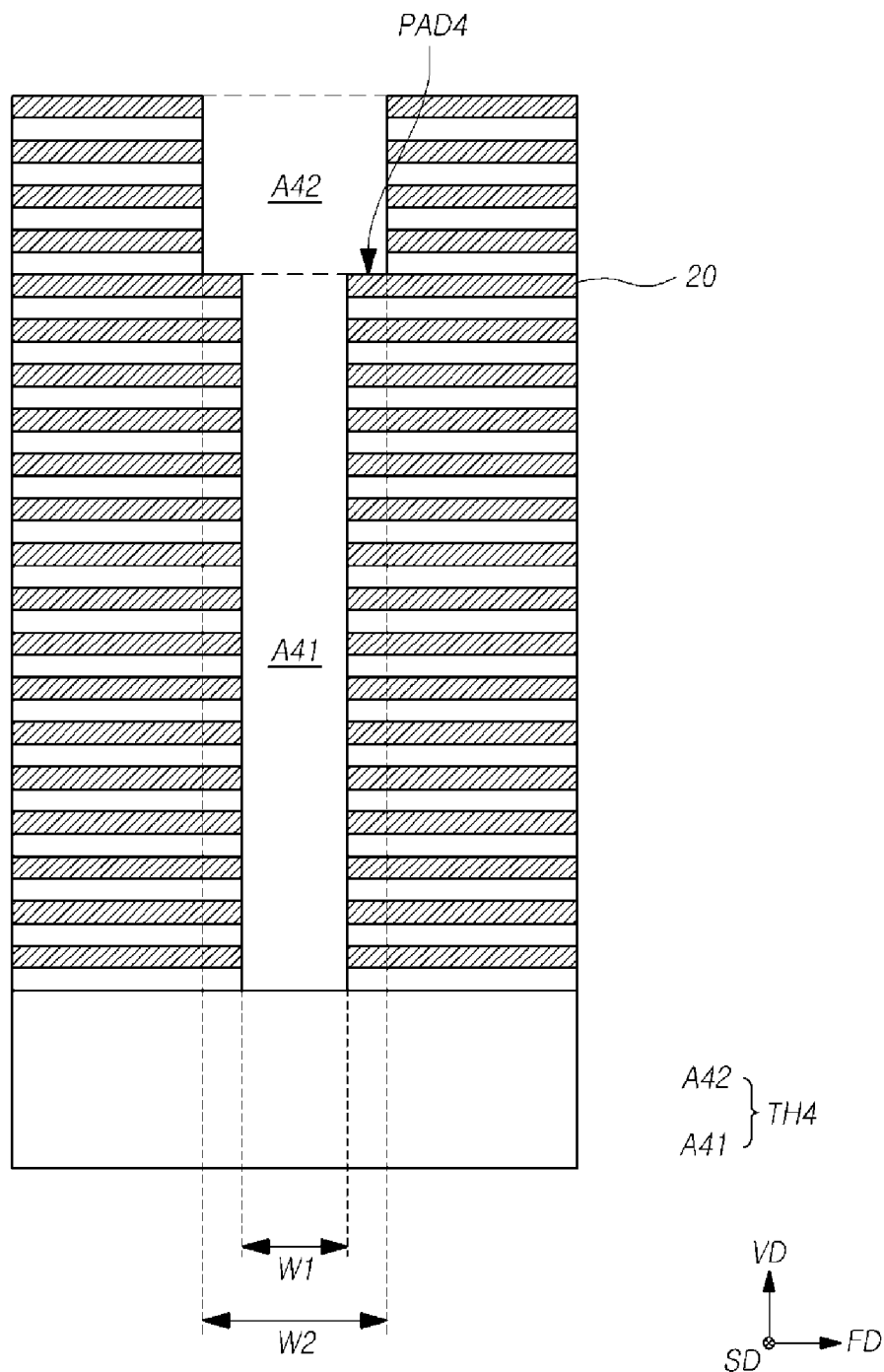

Referring to FIGS. 4D and 5D, the fourth through hole TH4 may include a first portion A41, and a second portion A42 that is positioned on the first portion A41 and communicates with the first portion A41.

The width of the first portion A41 of the fourth through hole TH4 may be W1, and the width of the second portion A42 of the fourth through hole TH4 may be W2. Due to the difference in size between the width W2 of the second portion A42 of the fourth through hole TH4 and the width W1 of the first portion A41 of the fourth through hole TH4, the fourth pad region PAD4 of the electrode layer 20 corresponding to the fourth through hole TH4 may be exposed.

The fourth pad region PAD4 is positioned at the lower end of the second portion A42 of the fourth through hole TH4, and when viewed from the top, may have a shape that surrounds the periphery of the first portion A41 of the fourth through hole TH4.

Hereinafter, a method for manufacturing a three-dimensional memory device in accordance with an embodiment of the present disclosure will be described with reference to FIGS. 6 to 8M. The first to fourth through holes TH1 to TH4 described above with reference to FIGS. 2 to 5D may be formed by using a patterning method to be described below. That is to say, the first to fourth through holes TH1 to TH4 of FIGS. 2 to 5D may be formed as a result of using the patterning method to be described below.

Figure 6:
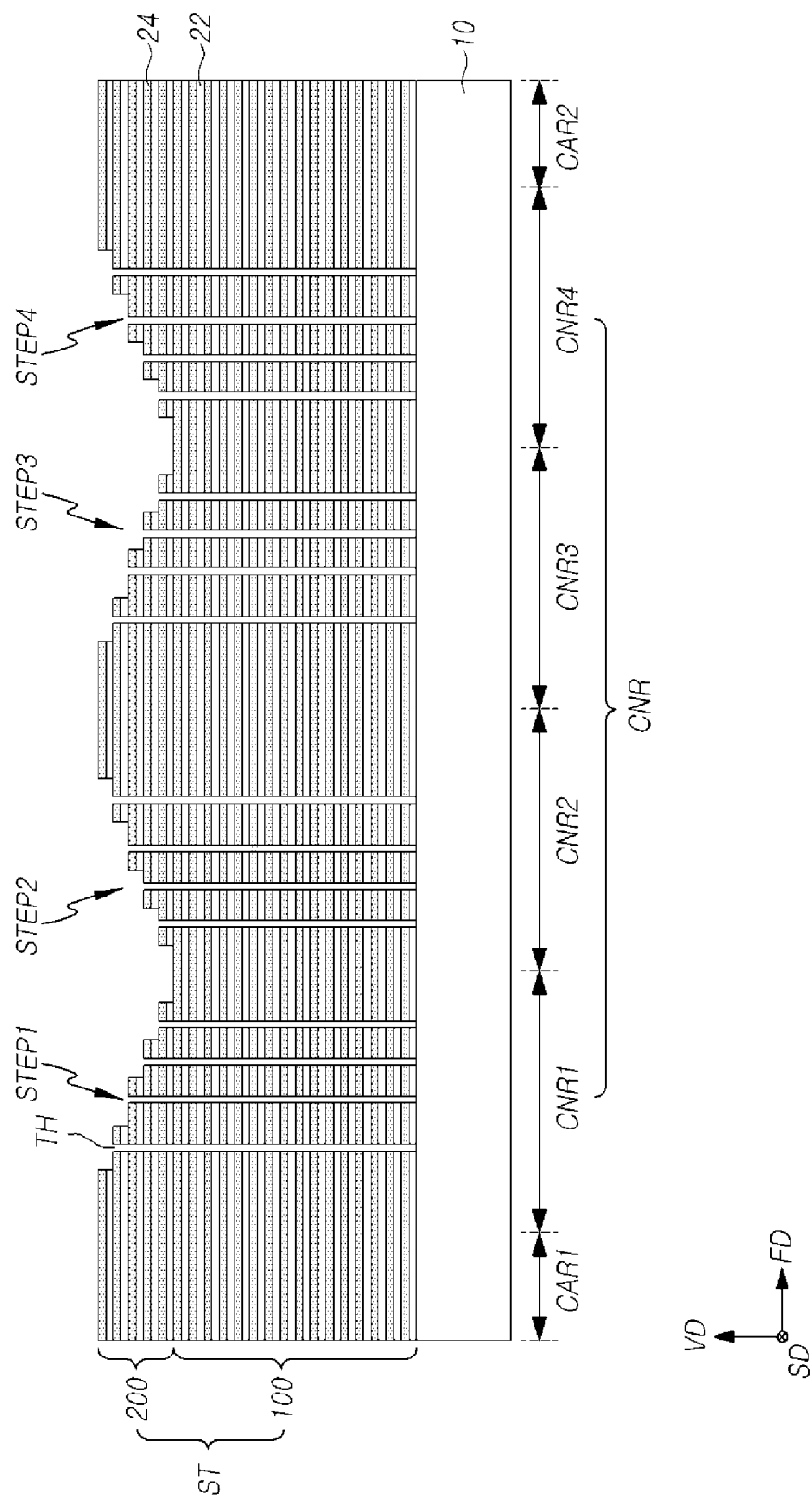
FIG. 6 is a cross-sectional view after initial through holes of a three-dimensional memory device in accordance with an embodiment of the present disclosure are formed.

FIG. 6 is a cross-sectional view after initial through holes of a three-dimensional memory device in accordance with an embodiment of the present disclosure are formed. FIGS. 7A to 7M are cross-sectional views illustrating process steps for forming through holes of a three-dimensional memory device in accordance with an embodiment of the present disclosure. FIGS. 8A to 8M are top views illustrating the process steps for forming the through holes of a three-dimensional memory device in accordance with an embodiment of the present disclosure. For the sake of simplicity in illustration, FIGS. 7A to 8M illustrate only one through hole for each of the first to fourth regions CNR1 to CNR4.

Referring to FIG. 6, a stack ST may be formed by forming a lower thin film stack 100 on a first cell array region CAR1, a connection region CNR and a second cell array region CAR2 of a substrate 10 and by stacking an upper thin film stack 200 on the lower thin film stack 100. Each of the lower thin film stack 100 and the upper thin film stack 200 may include a plurality of first material layers 24 and a plurality of second material layers 22, which are alternately stacked.

The first material layers 24 and the second material layers 22 may be formed of different materials. The second material layers 22 may be formed of a dielectric material that may be used in interlayer dielectric layers, and the first material layers 24 may be formed of a dielectric material that may be used as sacrificial layers. The first material layers 24 have a different etch selectivity from the second material layers 22. For example, the first material layers 24 may be formed as silicon nitride layers, and the second material layers 22 may be formed as silicon oxide layers.

Step structures STEP1 to STEP4 may be formed in first to fourth regions CNR1 to CNR4, respectively, of the upper thin film stack 200.

For example, a process for forming the step structures STEP1 to STEP4 may include steps of forming a mask pattern having openings that expose portions of the first to fourth regions CNR1 to CNR4, respectively, on the upper thin film stack 200; etching the upper thin film stack 200 in a unit etching process using the mask pattern as an etch mask; performing a trimming process to reduce the area of the mask pattern; and alternately repeating the unit etching process and the trimming process. The etching thickness of the unit etching process may be substantially the same as the vertical pitch of the first material layers 24. The vertical pitch of the first material layers 24 means the vertical distance between the top surfaces of the first material layers 24 that are adjacent to each other in the vertical direction VD. A plurality of step surfaces may be formed in each of the first to fourth regions CNR1 to CNR4 that correspond to the step structures STEP1 to STEP4, respectively.

Through holes TH may be formed to pass through the stack ST in the vertical direction VD. In FIG. 6, the through holes extend from the step surfaces of the step structures STEP1 to STEP4 through upper thin film stack 200 and lower thin film stack 100 to the substrate 10. A process for forming the through holes TH may include a step of forming a mask pattern having openings that expose portions of the step surfaces, respectively, on the stack ST, and a step of etching the stack ST using the mask pattern as an etch mask.

Figure 7A:
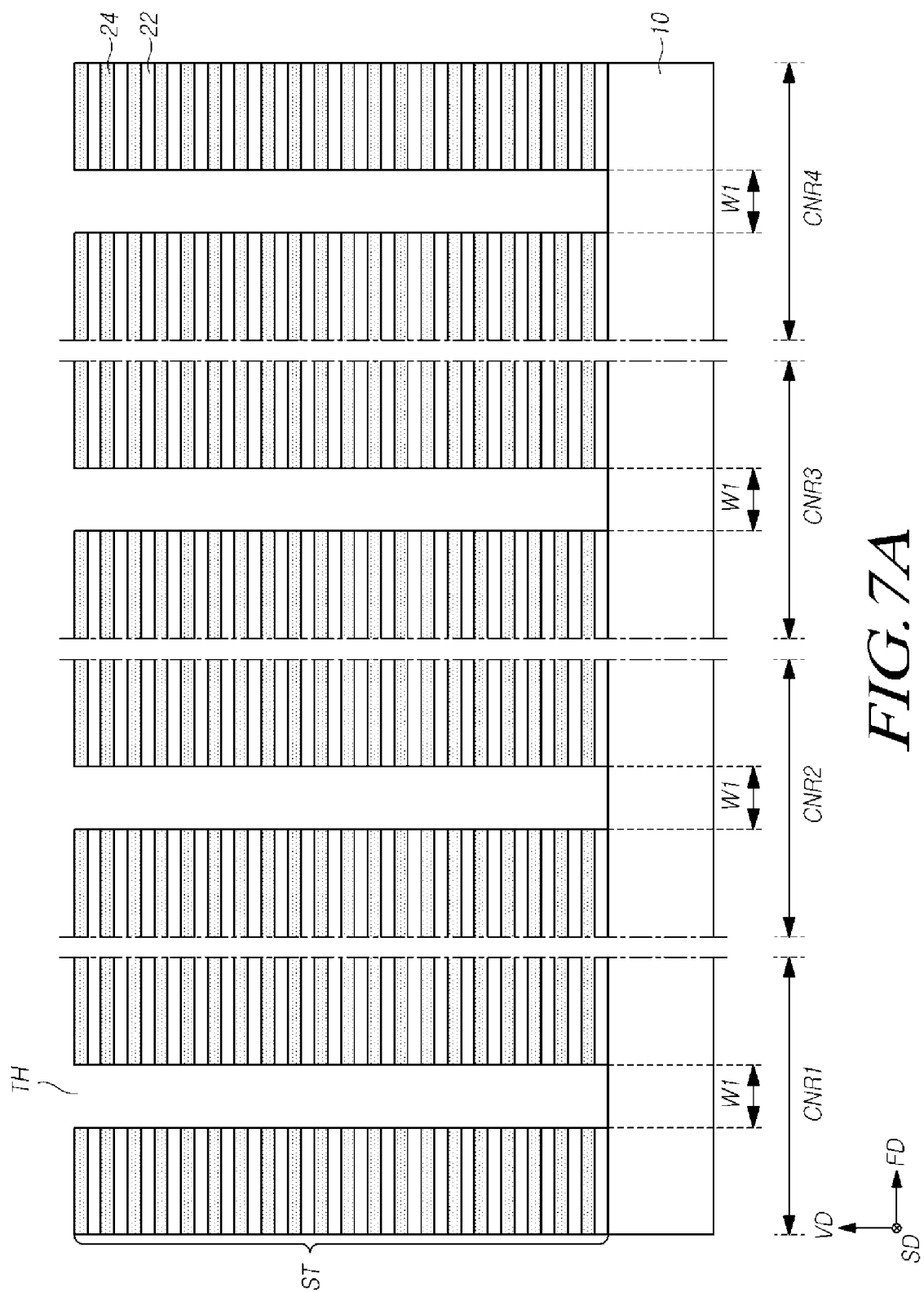
Figure 7B:
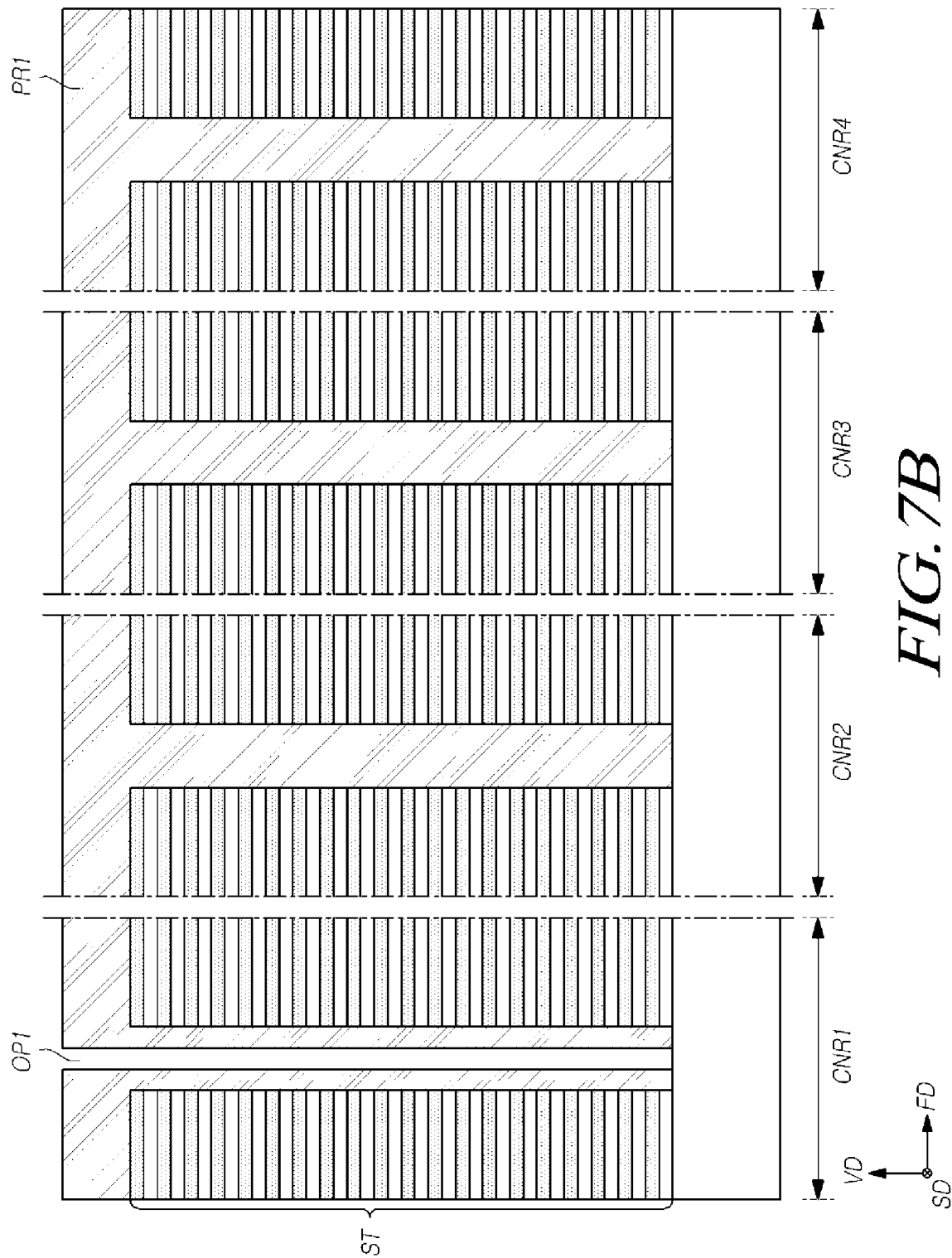

As illustrated in FIGS. 6 and 7A, the through holes TH may extend to the substrate 10 by passing through the stack ST. Referring to FIGS. 7A and 8A, each through hole TH may have a width of W1. Each through hole TH may include sidewalls formed of exposed portions of the alternating layers in the stack ST Referring to FIGS. 7B and 8B, a first mask PR1 may be formed to fill the through holes TH and cover the stack ST, and a first opening OP1, which passes through the first mask PR1, may be formed to align with the center portion of the through hole TH of the first region CNR1 by a patterning process. In the patterning process for forming the first opening OP1, the through hole TH of the first region CNR1, which has the width of W1, may be used as an overlay key.

Figure 8C:
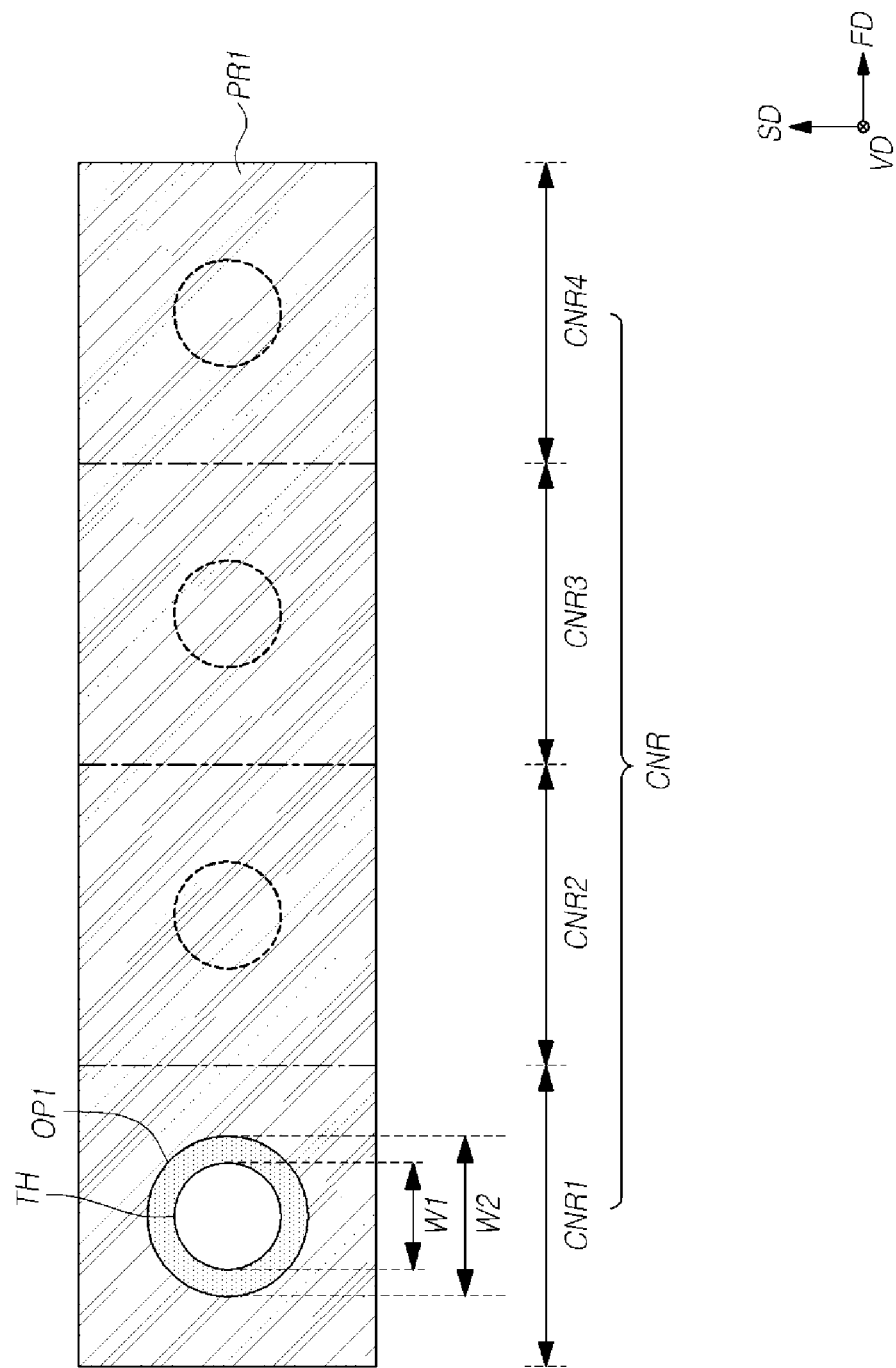

Referring to FIGS. 7C and 8C, a first isotropic etching process may be performed on the first mask PR1. The first isotropic etching process may reduce the area and thickness of the first mask PR1. For example, the first mask PR1 in the through hole TH of the first region CNR1 is etched to expose the portions of the stack ST common to the sidewalls of the previously formed through hole TH of FIG. 7A. In addition, the first opening OP1 in the remaining first mask PR1, which is disposed over stack ST in first region CNR1, is expanded or widened horizontally in directions parallel to the first direction FD and the second direction SD. Using the first isotropic etching process, the first opening OP1 may be expanded or widened horizontally relative to the through hole TH of the first region CNR1. As a result, in FIG. 8C, the width of the first opening OP1 may be larger than the width of the through hole TH. For instance, the width of the through hole TH may have the size of W1, and the width of the expanded first opening OP1 may have a size of W2, which is greater than W1.

Referring to FIGS. 7D and 8D, a first recess etching process of etching the stack ST using the isotropically etched first mask PR1 as an etch mask may be performed. The etching thickness of the first recess etching process may have a size corresponding to K (where K is a natural number equal to or greater than two) times the vertical pitch of the first material layers 24. FIG. 7D illustrates an example in which K is four.

Through the first recess etching process, the width of the upper portion of the through hole TH of the first region CNR1 is increased. For example, the width of the upper portion of the through hole TH of the first region CNR1 may be W2, which is larger than W1. The difference in size between the width W2 of the upper portion and the width W1 of the lower portion of the through hole TH of the first region CNR1 may correspond to the difference in size between the width of the second portion A12 and the width of the first portion A11 of the first through hole TH1 described above with reference to FIGS. 4A and 5A.

The first mask PR1 may be formed as a photoresist. The first mask PR1 that remains after the first recess etching process may be removed through a strip process.

Figure 7E:
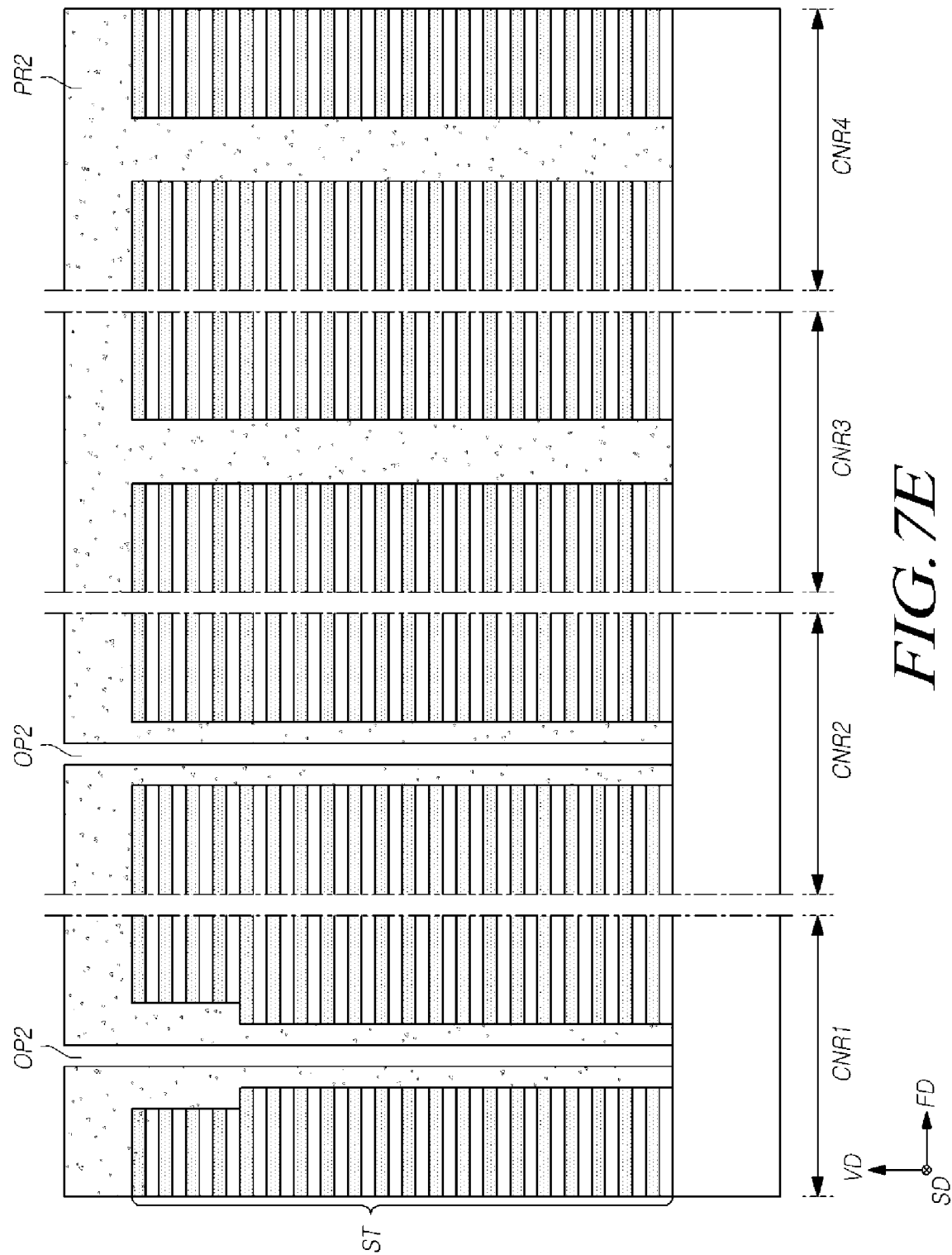

Referring to FIGS. 7E and 8E, a second mask PR2 may be formed to fill the through holes TH and cover the stack ST. Second openings OP2, which pass through the second mask PR2 in the vertical direction VD, may be formed by a patterning process in the center portion of the through hole TH of the first region CNR1 and in the center portion of the through hole TH of the second region CNR2. The center of a second opening OP2 may align with the center of a corresponding through hole TH.

In the patterning process for forming the second openings OP2, the lower portion of the through hole TH of the first region CNR1, which has the width of W1, and the through hole TH of the second region CNR2, which has the width of W1, may be used as an overlay key.

Figure 7F:
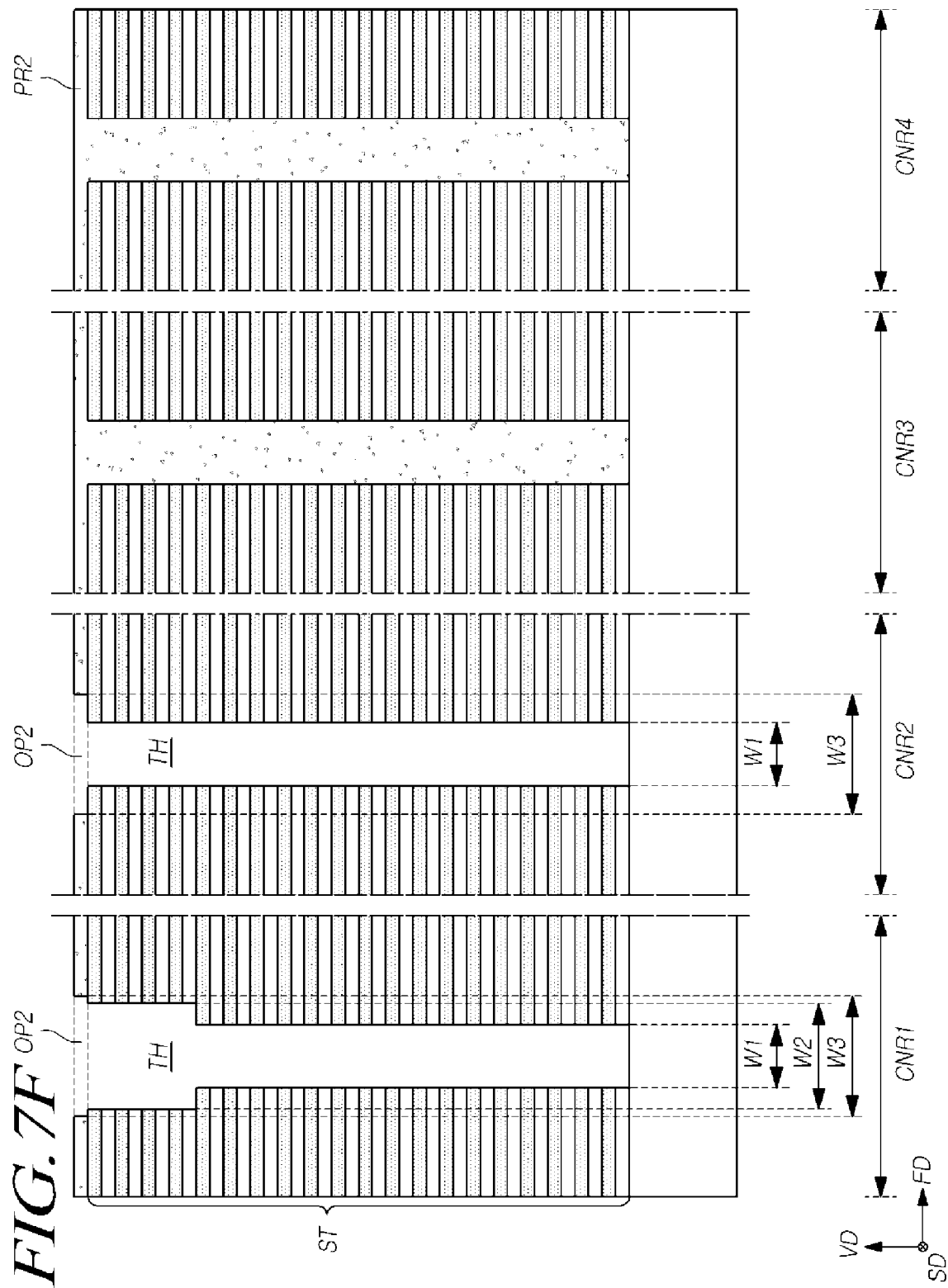
Figure 8F:
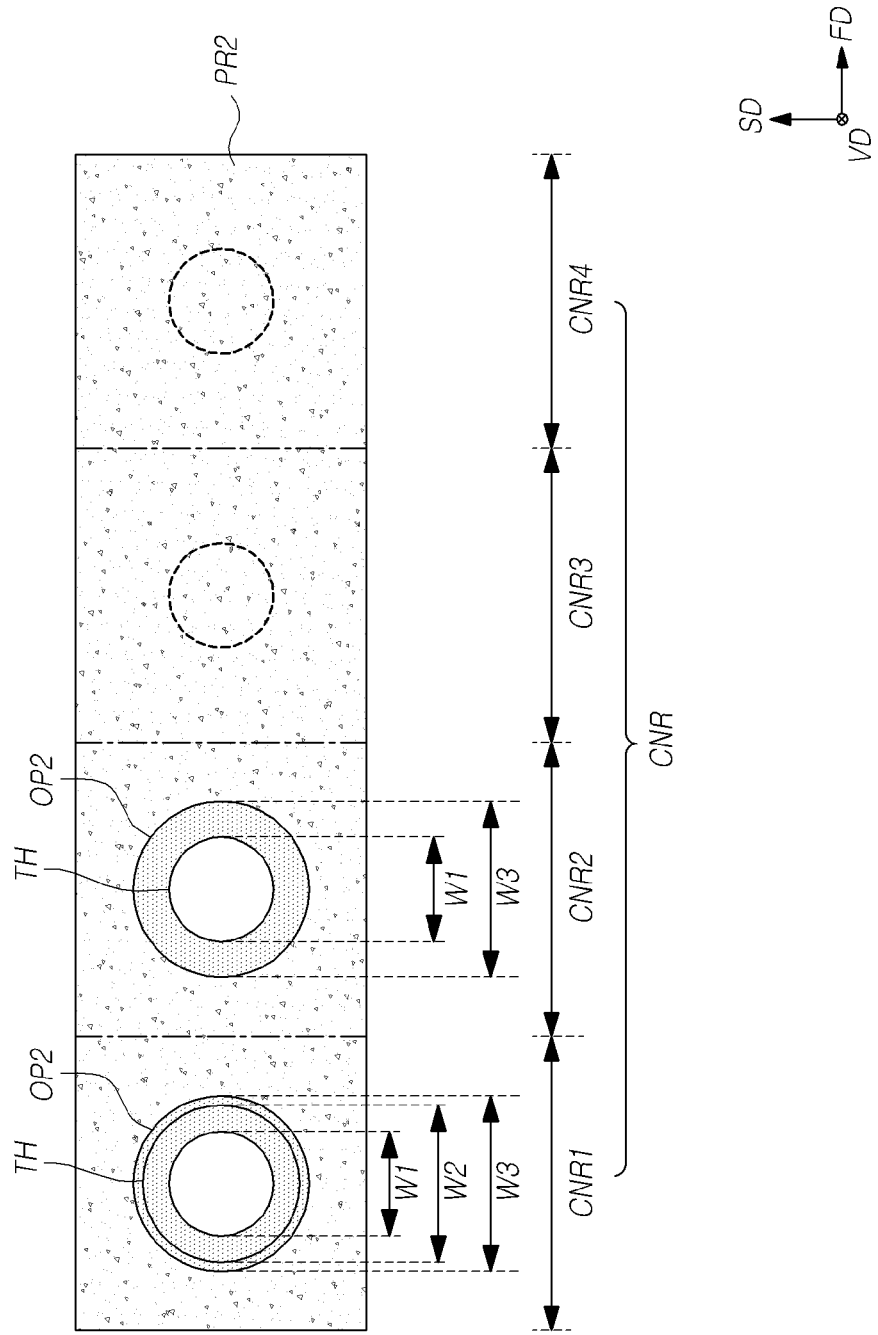

Referring to FIGS. 7F and 8F, a second isotropic etching process may be performed on the second mask PR2. The area and thickness of the second mask PR2 may be reduced in the second isotropic etching process. Portions of stack ST in the first region CNR1 that were previously exposed in the sidewalls of through hole TH of FIGS. 7A and 7D, and portions of stack ST in the second region CNR2 that were previously exposed in the sidewalls of through hole TH of FIG. 7A may be exposed again with the removal of the second mask PR2. In addition, the second openings OP2 are expanded or widened horizontally. In the second isotropic etching process, the size of the second openings OP2 may be expanded or widened, with the size adjusted depending on the size and location of the through holes TH of the first region CNR1 and the second region CNR2 such that a difference between the size of the second opening OP2 and the size of the through hole TH in the first region CNR1 become first preset value and a difference between the size of the second opening OP2 and the size of the through hole TH in the second region CNR2 become a second preset value. Thus, from a top view, the width of the second openings OP2 may have a size larger than the width of the through holes TH of both the first region CNR1 and the second region CNR2. For example, in second region CNR2, the width of the through hole TH may have the size of W1, and the width of the expanded second opening OP2 may have a size of W3, which is larger than W1. W3 may be slightly larger than W2, which is the width of the upper portion of the through hole TH of the first region CNR1.

Referring to FIGS. 7G and 8G, a second recess etching process may be performed to etch the stack ST using the isotropically etched second mask PR2 as an etch mask. The etching thickness of the second recess etching process may have a size corresponding to M (where M is a natural number equal to or greater than two) times the vertical pitch of the first material layers 24. FIG. 7G illustrates an example in which M is four.

The second recess etching process therefore extends, in a vertical direction VD, the width W2 of the upper portion of the through hole TH of the first region CNR1 (illustrated in FIG. 7F). The thickness of the stack ST including the lower portion of through hole TH in first region CNR1, which has a width W1, is reduced by the etching thickness of the second recess etching process.

The second recess etching process may be used to increase the width of the upper portion of the through hole TH of the first region CNR1 and the width of the upper portion of the through hole TH of the second region CNR2. For example, the width of the upper portion of the through hole TH of the first region CNR1 and the width of the upper portion of the through hole TH of the second region CNR2 may be etched to W3 through the etching thickness of the second recess etching process. W3 may be larger than W2. The difference in size between the width W3 of the upper portion and the width W1 of the lower portion of the through hole TH of the second region CNR2 may correspond to the difference in size between the width of the second portion A22 and the width of the first portion A21 of the second through hole TH2 described above with reference to FIGS. 4B and 5B.

The second mask PR2 may be formed as a photoresist. The second mask PR2 remaining after the second recess etching process may be removed through a strip process.

Figure 7H:
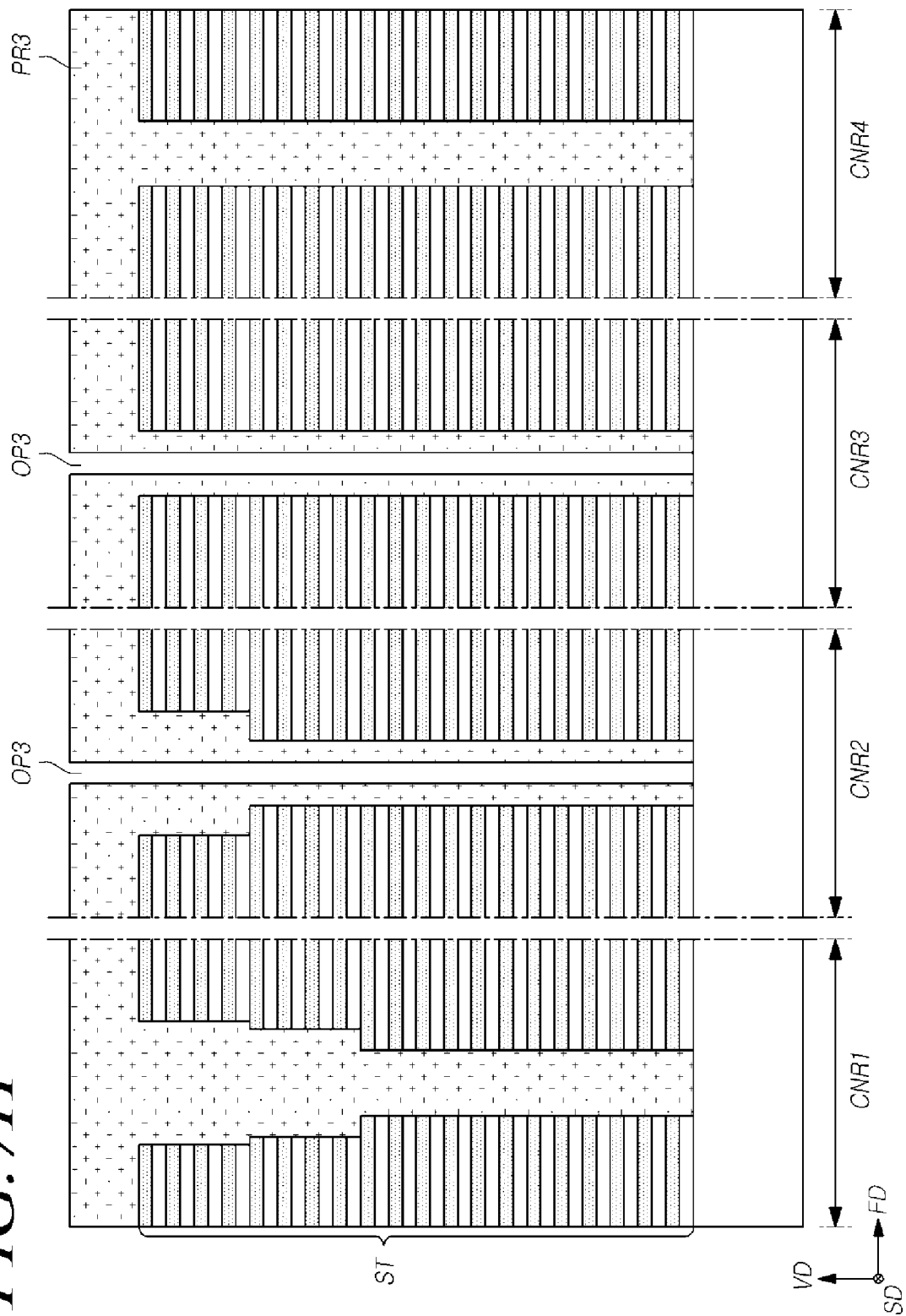

Referring to FIGS. 7H and 8H, a third mask PR3 may be formed to fill the through holes TH and cover the stack ST. Third openings OP3 that vertically pass through the third mask PR3 may be formed at the center portion of the through hole TH of the second region CNR2 and the center portion of the through hole TH of the third region CNR3 by a patterning process. The center of a third opening OP3 may align with the center of a corresponding through hole TH. No third opening OP3 is formed in the first region CNR1 or the fourth region CNR4.

In the patterning process for forming the third openings OP3, the lower portion of the through hole TH of the second region CNR2, which has the width of W1, and the through hole TH of the third region CNR3, which has the width of W1, may be used as an overlay key.

Figure 8I:
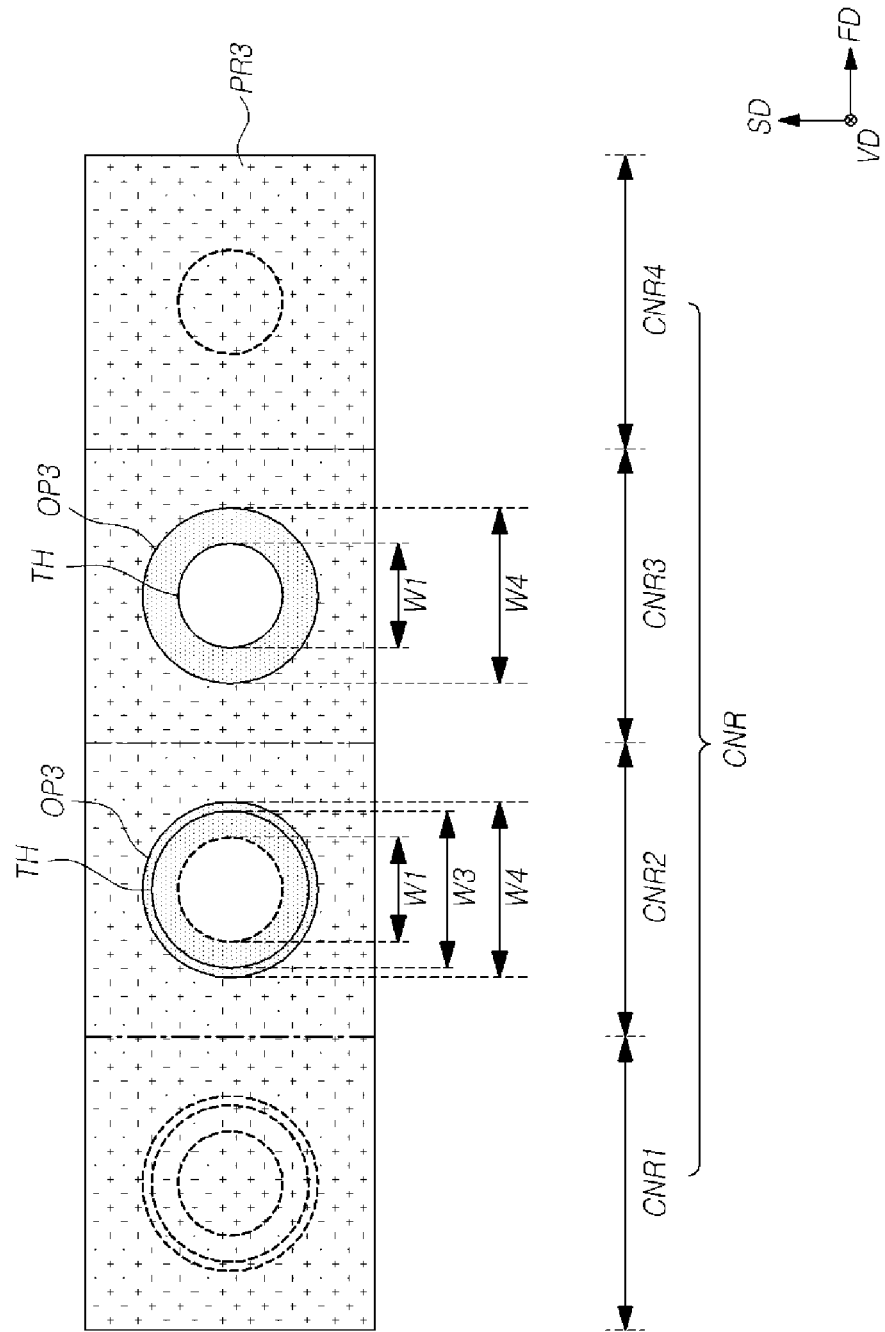

Referring to FIGS. 7I and 8I, a third isotropic etching process may be performed on the third mask PR3. By the third isotropic etching process, the area and thickness of the third mask PR3 may be reduced. Portions of stack ST in the second region CNR2 and in the third region CNR3 that, in earlier processes (see FIGS. 7G and 7A), were previously exposed in the sidewalls of the respective through holes TH may be exposed again with the removal of the third mask PR3. In addition, the third openings OP3 are expanded or widened horizontally. In the third isotropic etching process, the size of the third openings OP3 may be expanded or widened, with the size adjusted depending on the size and location of the through holes TH of the second region CNR2 and the third region CNR3, such that a difference between the size of the third opening OP3 and the size of the through hole TH in the second region CNR2 become third preset value and a difference between the size of the third opening OP3 and the size of the through hole TH in the third region CNR3 become a fourth preset value. Thus, from a top view, the width of the third openings OP3 may have a size larger than the width of the through hole TH of both the second region CNR2 and the third region CNR3. For example, the width of the through hole TH of the third region CNR3 may have the size of W1, and the width of the expanded third opening OP3 may have a size of W4, which is larger than W1. W4 may be slightly larger than W3, which is the width of the upper portion of the through hole TH of the second region CNR2.

Figure 8J:
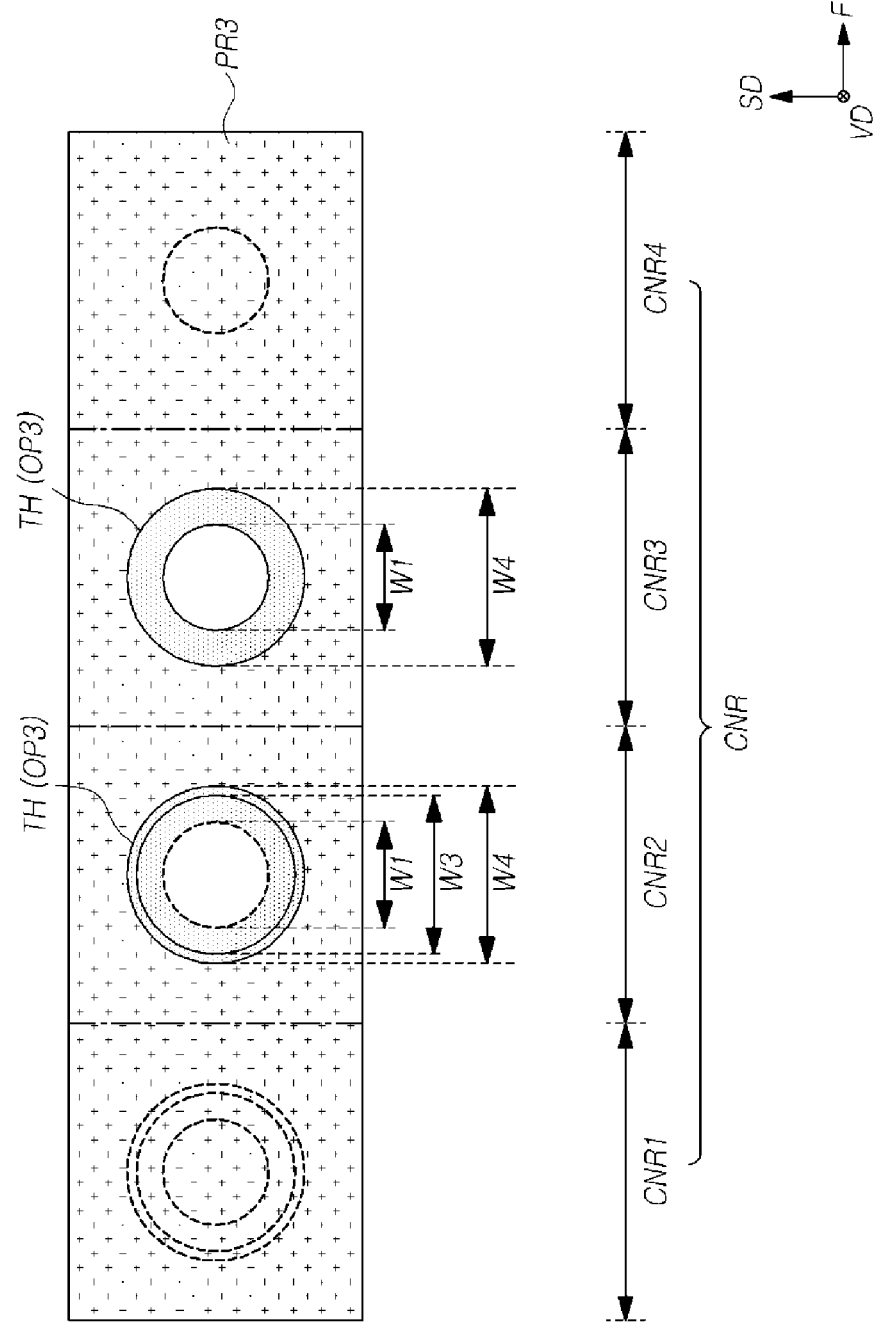

Referring to FIGS. 7J and 8J, a third recess etching process may be performed to etch the stack ST using the isotropically etched third mask PR3 as an etch mask. The etching thickness of the third recess etching process may have a size corresponding to N (where N is a natural number equal to or greater than two) times the vertical pitch of the first material layers 24. FIG. 7J illustrates a case where N is twelve.

The third recess etching process therefore extends, in a vertical direction VD, the width W3 of the upper portion of the through hole TH of the second region CNR2 (illustrated in FIG. 7I). In the second region CNR2, the thickness of the stack ST including the lower portion of through hole TH, which has a width W1, is reduced by the etching thickness of the third recess etching process.

The third recess etching process may also be used to increase the width of the upper portion of the through hole TH of the second region CNR2 and the width of the upper portion of the through hole TH of the third region CNR3. For example, the width of the upper portion of the through hole TH of the second region CNR2 and the width of the upper portion of the through hole TH of the third region CNR3 may etched to through the etching thickness of the third recess etching process. W4 may be larger than W3. The difference in size between the width W4 of the upper portion and the width W1 of the lower portion of the through hole TH of the third region CNR3 may correspond to the difference in size between the width of the second portion A32 and the width of the first portion A31 of the third through hole TH3 described above with reference to FIGS. 4C and 5C.

The third mask PR3 may be formed as a photoresist. The third mask PR3 that remains after the third recess etching process may be removed through a strip process.

Figure 7K:
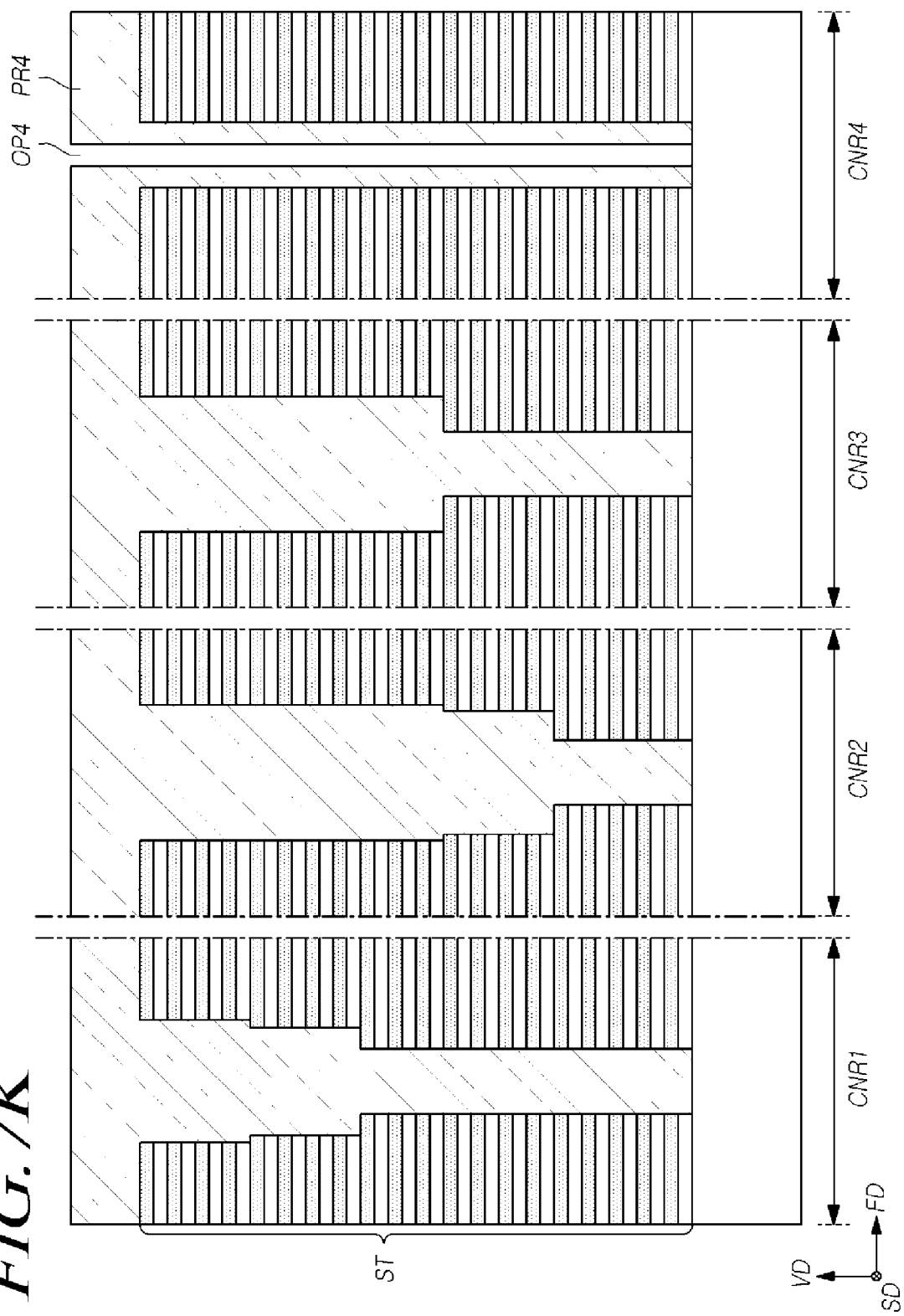
Figure 8K:
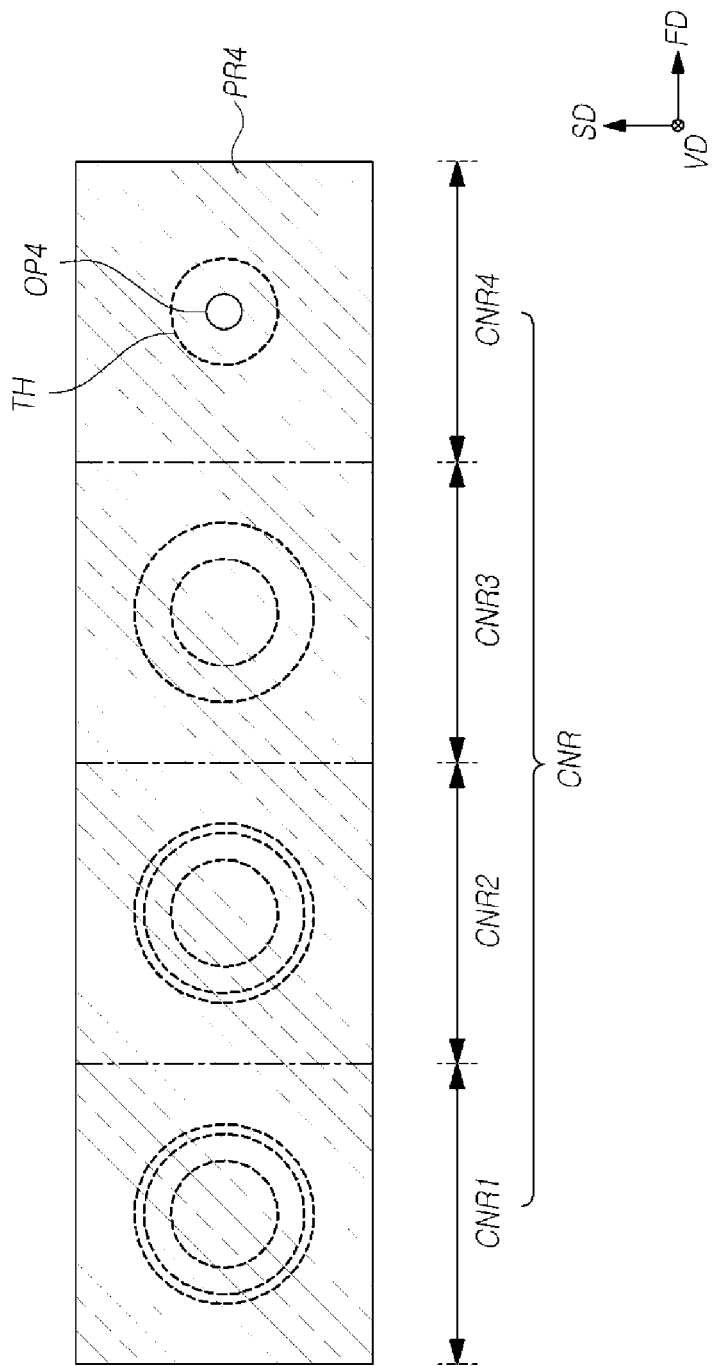

Referring to FIGS. 7K and 8K, a fourth mask PR4 may be formed to fill the through holes TH and to cover the stack ST. A fourth opening OP4, which passes vertically through the fourth mask PR4, may be formed at the center portion of the through hole TH of the fourth region CNR4 by a patterning process. In the patterning process for forming the fourth opening OP4, the through hole TH of the fourth region CNR4, which has the width of W1, may be used as an overlay key. The center of a fourth opening OP4 may align with the center of a corresponding through hole TH. No fourth openings OP4 are formed in the first through third regions CNR1 to CNR3.

Figure 8L:
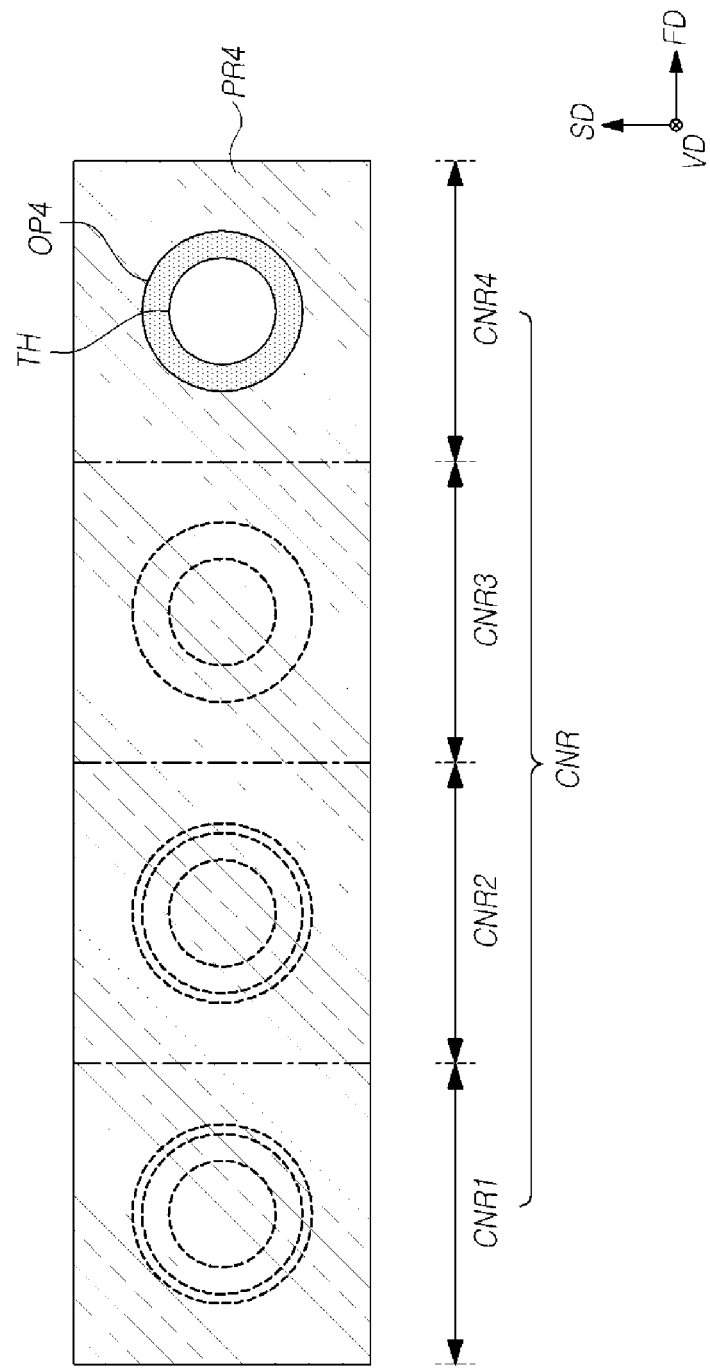

Referring to FIGS. 7L and 8L, a fourth isotropic etching process may be performed on the fourth mask PR4. The fourth isotropic etching process may reduce the area and thickness of the fourth mask PR4 in the through hole TH of the fourth region CNR4 is etched to expose the portions of the stack ST common to the sidewalls of the previously formed through hole TH of FIG. 7A. In addition, the fourth opening OP4 in the remaining first mask PR4, which is disposed over stack ST in fourth region CNR4, is expanded or widened horizontally in directions parallel to the first direction FD and the second direction SD. Using the fourth isotropic etching process, the fourth opening OP4 may be expanded or widened horizontally relative to the through hole TH of the fourth region CNR4. For example, in FIG. 7L, the width of the through hole TH of the fourth region CNR4 may have the size of W1, and the width of the expanded fourth opening OP4 may have the size of W2 larger than W1.

Referring to FIGS. 7M and 8M, a fourth recess etching process of etching the stack ST using the isotropically etched fourth mask PR4 as an etch mask may be performed. The etching thickness of the fourth recess etching process may have a size corresponding to R (where R is a natural number equal to or greater than two) times the vertical pitch of the first material layers 24. FIG. 7M illustrates an example in which R is four.

Through the fourth recess etching process, the width of the upper portion of the through hole TH of the fourth region CNR4 is increased. For example, the width of the lower portion of the through hole TH of the fourth region CNR4 may be W1, and the width of the upper portion of the through hole TH of the fourth region CNR4 may be W2. The difference in size between the width W2 of the upper portion and the width W1 of the lower portion of the through hole TH of the fourth region CNR4 may correspond to the difference in size between the width of the second portion A42 and the width of the first portion A41 of the fourth through hole TH4 described above with reference to FIGS. 4D and 5D.

The fourth mask PR4 may be formed as a photoresist. The fourth mask PR4 remaining after the fourth recess etching process may be removed through a strip process. Thereafter, although not illustrated, electrode layers may be formed by replacing the first material layers 24 with a conductive material.

FIGS. 9A to 9F are cross-sectional views illustrating process steps for manufacturing a three-dimensional memory device in a comparative example, and FIG. 10 is a top view illustrating through holes of the three-dimensional memory in a comparative example.

Similar to that described above with reference to FIG. 6, a stack ST may be formed by stacking a lower thin film stack 100 and an upper thin film stack 200 on a substrate 10, and step structures may be formed in first to fourth regions CNR1 to CNR4, respectively, of the upper thin film stack 200.

Figure 9A:
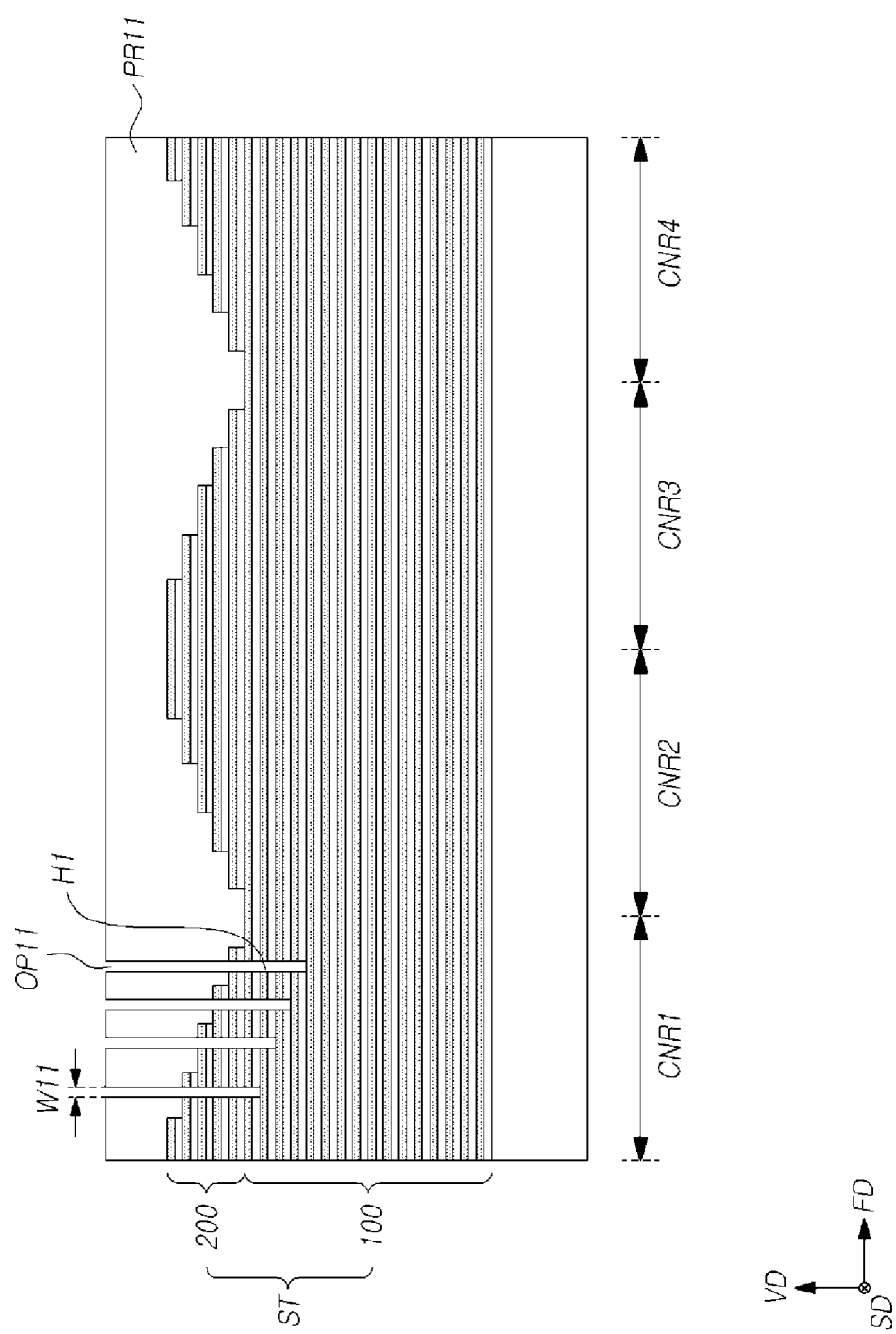

Referring to FIG. 9A, a first mask PR11 is formed on the stack ST, which is formed with step structures. First openings OP11 are formed in the first mask PR11. The first openings OP11 expose step surfaces, respectively, of the step structure of the first region CNR1.

First holes H1 are formed by etching portions of the stack ST that are exposed by the first openings OP11 through a first recess etching process that uses the first mask PR11 as an etch mask.

Figure 9B:
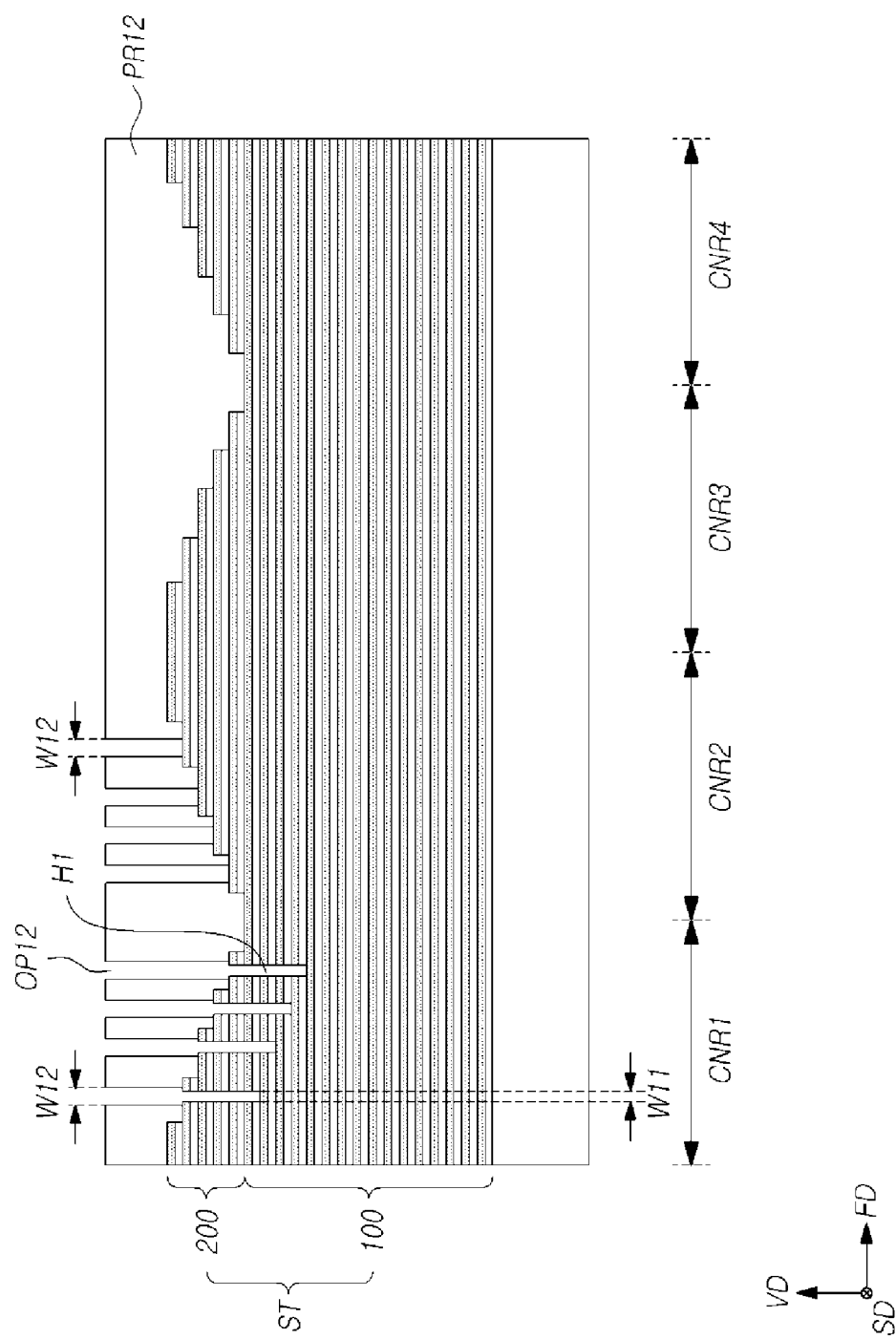

Referring to FIG. 9B, after removing the first mask PR11 remaining after the first recess etching process, a second mask PR12 is formed on the stack ST.

Second openings OP12 are formed in the second mask PR12. The second openings OP12 expose the first holes H1 of the first region CNR1 and stepped surfaces of the step structure of the second region CNR2, respectively. To facilitate the overlay between the first hole H1 and the second opening OP12, the second opening OP12 should be formed to have a width larger by at least a predetermined size than the first hole H1. For example, when the width of the first hole H1 has a size of W11, the width of the second opening OP12 should have a size of W12, which is larger by at least a predetermined size than W11.

Referring to FIG. 9C, portions of the stack ST that are exposed by the second openings OP12 are etched by a second recess etching process using the second mask PR12 as an etch mask. As a result of the second recess etching process, the depth of the first holes H1 of the first region CNR1 is increased, and second holes H2 are formed in the second region CNR2.

Referring to FIG. 9D, after removing the second mask PR12 remaining after the second recess etching process, a third mask PR13 is formed on the stack ST.

Third openings OP13 that expose the second holes H2 of the second region CNR2 and stepped surfaces of the step structure of the third region CNR3, respectively, are formed in the third mask PR13. To facilitate the overlay between the second hole H2 and the third opening OP13, the third opening OP13 should be formed to have a width larger by at least a predetermined size than the second hole H2. For example, when the width of the second hole H2 is W12, the width of the third opening OP13 should have a size of W13, which is larger by at least a predetermined size than W12.

Figure 9E:
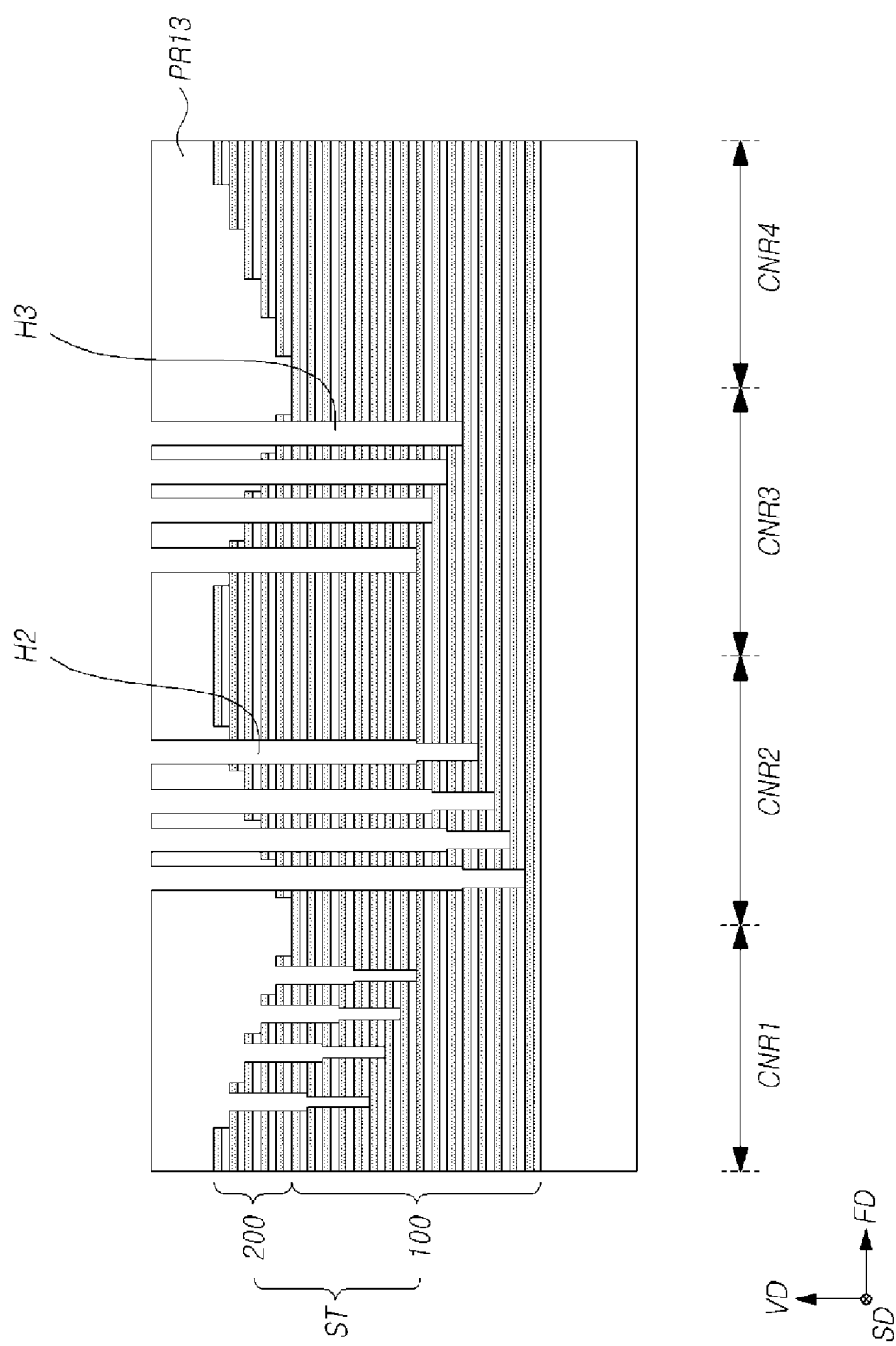

Referring to FIG. 9E, portions of the stack ST that are exposed by the third openings OP13 are etched by a third recess etching process using the third mask PR13 as an etch mask. By the third recess etching process, the depth of the second holes H2 of the second region CNR2 is increased, and third holes H3 are formed in the third region CNR3.

Figure 9F:
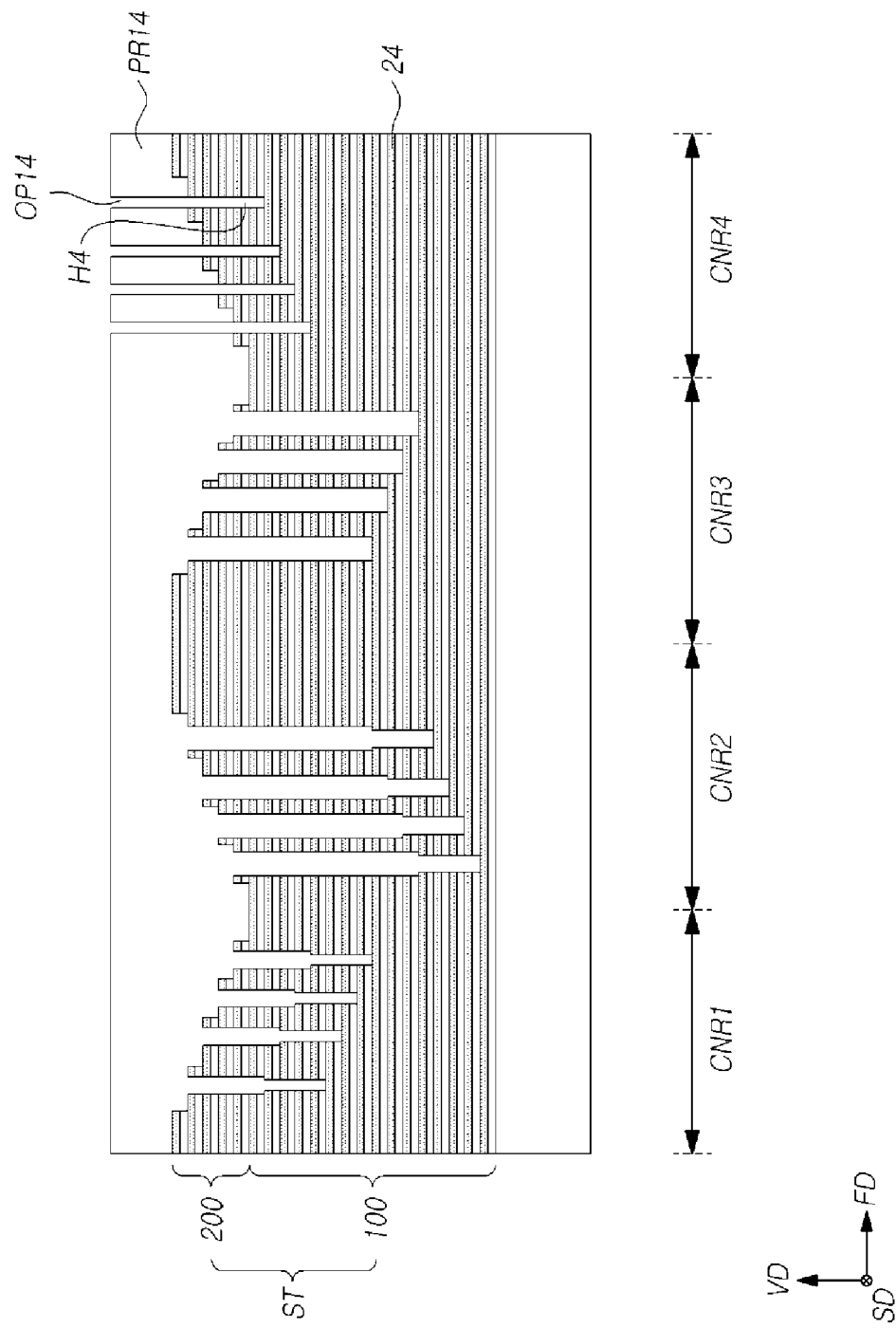

Referring to FIG. 9F, after removing the third mask PR13 remaining after the third recess etching process, a fourth mask PR14 is formed on the stack ST, and fourth openings OP14 are formed in the fourth mask PR14 that expose step surfaces of the step structure of the fourth region CNR4.

Fourth holes H4 are formed by etching portions of the stack ST that are exposed by the fourth openings OP14, through a fourth recess etching process that uses the fourth mask PR14 as an etch mask.

Thereafter, although not illustrated, the fourth mask PR14 remaining after the fourth recess etching process is removed, and electrode layers may be formed by replacing first material layers 24 with a conductive material. After the processes described above with reference to FIGS. 9A through 9F, pad regions of the electrode layers are positioned at the bottom surfaces of the first to fourth holes H1 to H4.

As described above with reference to FIG. 9b, in order for the overlay with the first hole H1, the second opening OP12 of the second mask PR12 should be formed to have a width larger by at least a predetermined size than the first hole H1, and as described above with reference to FIG. 9d, in order for the overlay with the second hole H2, the third opening OP13 of the third mask PR13 should be formed to have a width larger by at least a predetermined size than the second hole H2. In other words, when forming an opening in a mask, the width of the opening should be larger by at least a predetermined size than the width of an underlying hole in order for the overlay with the underlying hole. The width of an opening, however, is increased by at least a predetermined size each time a recess etching process is performed. As a result, the widths of the holes continue to increase incrementally from each recess etching process. Accordingly, as the width of the hole becomes excessively large, failures may occur. For example, as illustrated in FIG. 10, the electrode layers of an electrode structure ES are disconnected by the presence of the holes H2 and H3.

In contrast, as described above with reference to FIGS. 6 to 8M, according to embodiments of the disclosure, in the process of patterning masks used in recess etch processes, by forming openings that pass through the first to fourth masks PR1 to PR4, by using, as an overlay key, the through holes TH formed during an initial process and having the width of W1, and isotropically etching the first to fourth masks PR1 to PR4 on the basis of the through holes TH having the width of W1, it is possible to prevent the widths of openings and holes from becoming excessively large even when recess etching processes are repeated, and it is possible to prevent the occurrence of a failure in which the electrode layers of the electrode structure ES are disconnected by the presence of the holes.

Figure 11:
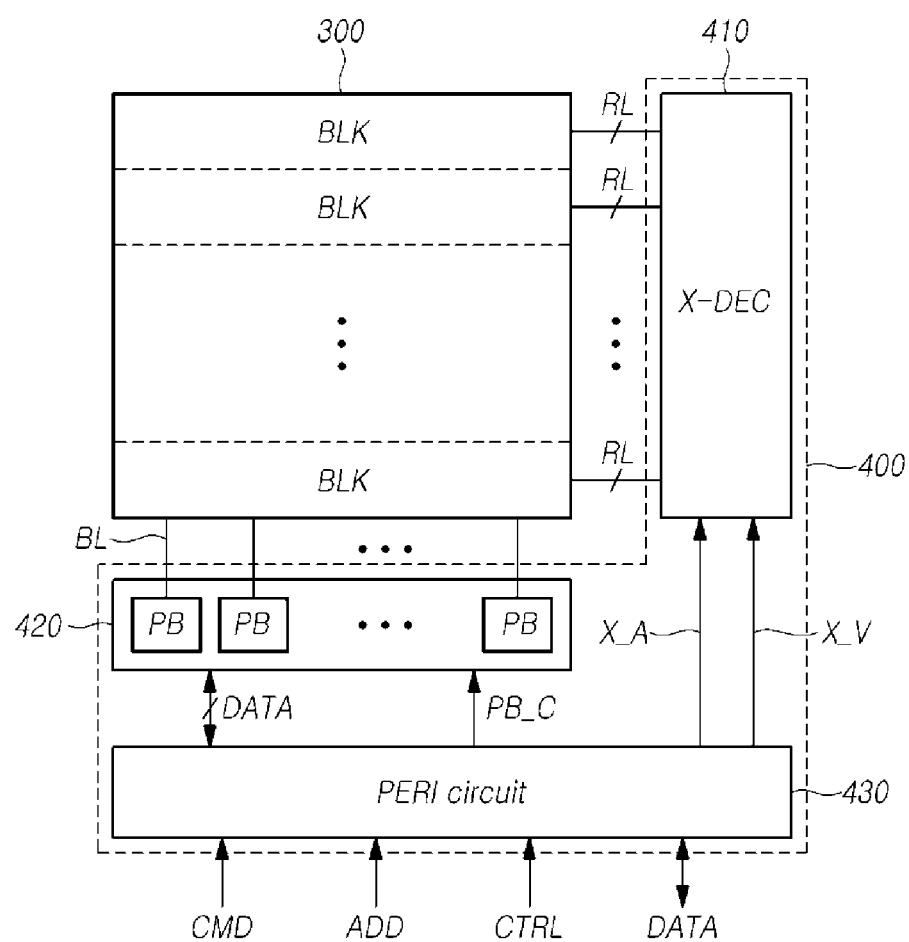
FIG. 11 is a block diagram illustrating a three-dimensional memory device in accordance with an embodiment of the present disclosure.

FIG. 11 is a block diagram a three-dimensional memory device in accordance with an embodiment of the present disclosure.

Referring to FIG. 11, a memory device in accordance with an embodiment of the disclosure may include a memory cell array 300 and a logic circuit 400. The logic circuit 400 may include a row decoder (X-DEC) 410, a page buffer circuit 420 and a peripheral circuit (PERI circuit) 430.

The memory cell array 300 may be coupled to the row decoder (X-DEC) 410 through a plurality of row lines RL. The row lines RL may include at least one drain select line, a plurality of word lines and at least one source select line. The memory cell array 300 may be coupled to the page buffer circuit 420 through bit lines BL.

The memory cell array 300 may include a plurality of memory blocks BLK. A memory block BLK may include a plurality of pages. The memory block BLK may be a basic unit of an erase operation, and the page may be a basic unit of a read operation.

Although not illustrated, memory cell array 300 may include a plurality of memory cells that are disposed in regions where the plurality of bit lines BL and the plurality of word lines WL intersect. The memory cell may be a volatile memory cell that loses data stored therein when power supply is cut off, or may be a nonvolatile memory cell that retains data stored therein even when power supply is cut off. For example, when the memory cell is a volatile memory cell, the memory device may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cell is a nonvolatile memory cell, the memory device may be an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The memory device may be a hybrid memory that includes both volatile memory cells and nonvolatile memory cells.

The memory cell may be a single level cell (SLC) that stores one-bit data or a multi-level cell (MLC) that stores two or more-bit data. The multi-level cell may store two-bit data, three-bit data, four-bit data, and so forth. The cell region 110 may include at least one of single level cells and multi-level cells.

The row decoder (X-DEC) 410 may select any one from among the memory blocks BLK included in the memory cell array 300, in response to a row address X_A provided from the peripheral circuit (PERI circuit) 430. The row decoder (X-DEC) 410 may transfer an operating voltage X_V, provided from the peripheral circuit (PERI circuit) 430, to row lines RL coupled to a memory block BLK selected from among the memory blocks BLK included in the memory cell array 300.

The page buffer circuit 420 may include a plurality of page buffers PB, which are coupled to the bit lines BL, respectively. The page buffer circuit 420 may receive a page buffer control signal PB_C from the peripheral circuit (PERI circuit) 430, and may transmit and receive a data signal DATA to and from the peripheral circuit (PERI circuit) 430.

The page buffer circuit 420 may control the bit lines BL, which are arranged in the memory cell array 300, in response to the page buffer control signal PB_C. For example, the page buffer circuit 420 may detect data, stored in a memory cell of the memory cell array 300, by sensing the signal of a bit line BL of the memory cell array 300 in response to the page buffer control signal PB_C, and may transmit the data signal DATA to the peripheral circuit (PERI circuit) 430 depending on the detected data. The page buffer circuit 420 may apply a signal to the bit line BL based on the data signal DATA, received from the peripheral circuit (PERI circuit) 430, in response to the page buffer control signal PB_C, and thereby, may write data to the memory cell of the memory cell array 300. The page buffer circuit 420 may write data to or read data from memory cells, which are coupled to an activated word line.

The peripheral circuit (PERI circuit) 430 may receive a command signal CMD, an address signal ADD and a control signal CTRL from outside the memory device, and may transmit and receive data DATA to and from a device outside the memory device, for example, a memory controller. The peripheral circuit (PERI circuit) 430 may output signals for writing data to the memory cell array 300 or reading data from the memory cell array 300, for example, the row address X_A, the page buffer control signal PB_C and so forth, based on the command signal CMD, the address signal ADD and the control signal CTRL. The peripheral circuit (PERI circuit) 430 may generate various voltages including the operating voltage X_V, which are required in the memory device.

The memory cell array 300 and the logic circuit 400 may be vertically overlapped with each other. The memory device according to the present embodiment may be provided in a Peri Under Cell (PUC) structure or a Peri Over Cell (POC) structure.

Figure 12:
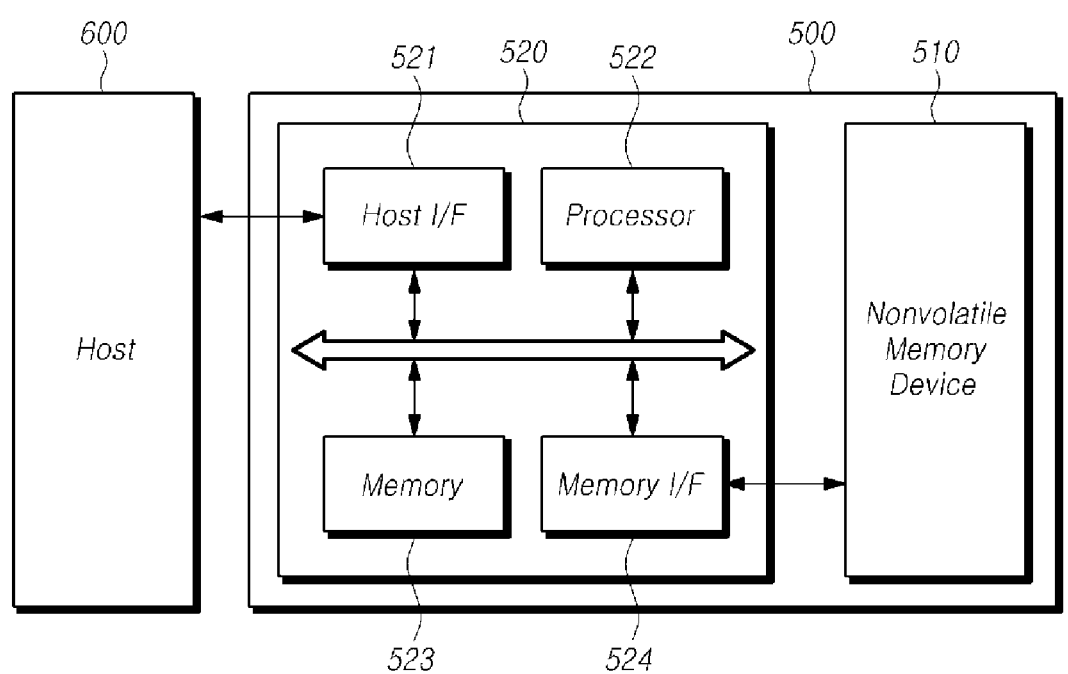
FIG. 12 is a block diagram schematically illustrating a memory system including a three-dimensional memory device in accordance with an embodiment of the present disclosure.

FIG. 12 is a block diagram schematically illustrating a memory system including a three-dimensional memory device in accordance with an embodiment of the present disclosure.

Referring to FIG. 12, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface that is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on memory cells.

While FIG. 12 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include memory devices according to the embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface 521, a processor 522, the memory 523 and a memory interface 524. Although not illustrated in FIG. 12, the controller 520 may further include an ECC (error correction code) engine that generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) that caches map data referred to by the processor 522 among map data stored in the memory 523.

Figure 13:
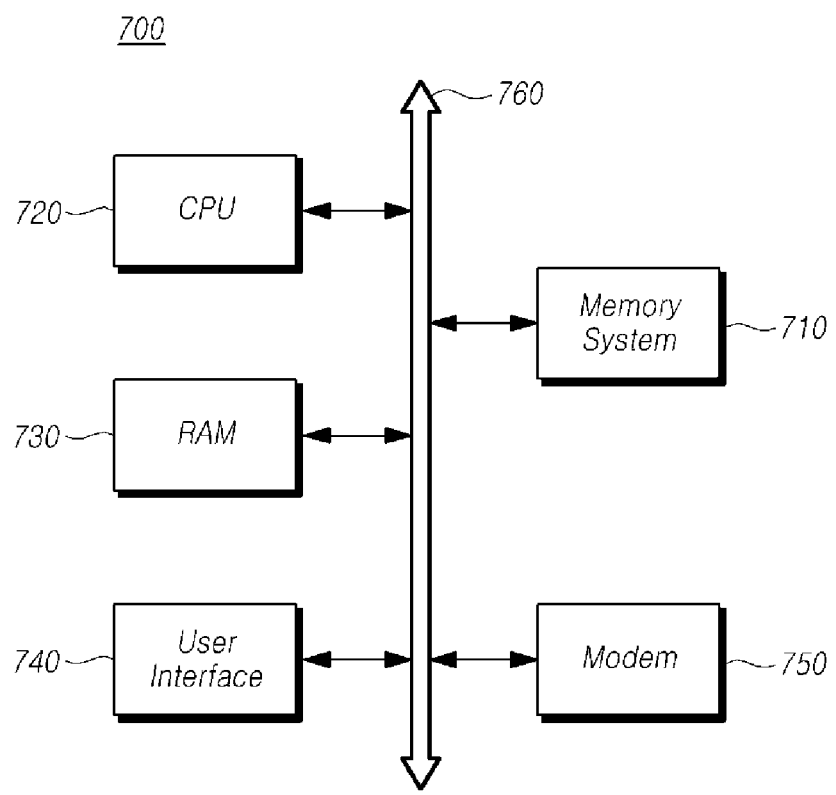
FIG. 13 is a block diagram schematically illustrating a computing system including a three-dimensional memory device in accordance with an embodiment of the present disclosure.

FIG. 13 is a block diagram schematically illustrating a computing system including a three-dimensional memory device in accordance with embodiments of the disclosure.

Referring to FIG. 13, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) that uses a nonvolatile memory to store data. Otherwise, the memory system 710 may be provided as a fusion flash memory (for example, a OneNAND flash memory).

Although the detailed description of the present invention described above has been described with reference to the embodiments of the present invention, those skilled in the art or those having ordinary skill in the art will understand that the present invention can be variously modified and changed without departing from the spirit and scope of the present invention described in the claims to be described later.

What is claimed is:

1. A method for manufacturing a three-dimensional memory device, comprising:
   forming a through hole that passes through a stack including a plurality of first material layers and a plurality of second material layers alternately stacked on a substrate in a vertical direction;
   forming a mask to fill the through hole and to cover the stack;
   forming an opening that passes vertically through the mask and that aligns with a center portion of the through hole;
   expanding, in a horizontal direction, the opening in the mask disposed on the stack to expose the through hole and a portion of a top surface of the stack around the through hole; and
   partially etching the stack exposed by the opening.

2. The method according to claim 1, wherein in the forming of the opening, the through hole is used as an overlay key.

3. The method according to claim 1, wherein isotropic etching of the mask widens the opening.

4. The method according to claim 1, wherein in the expanding of the opening, an expansion width of the opening is adjusted on the basis of a sidewall of the through hole.

5. A method for manufacturing a three-dimensional memory device, comprising:
   forming a first through hole and a second through hole that pass through a stack including a plurality of first material layers and a plurality of second material layers alternately stacked on a substrate in a vertical direction;
   forming a first mask that fills the first and second through holes and covers the stack;
   forming a first opening that passes through the first mask at a center portion of the first through hole;
   expanding the first opening in the first mask in a horizontal direction to expose the first through hole and a top surface of the stack around the first through hole;
   partially etching the stack exposed by the expanded first opening;
   forming a second mask that fills the first and second through holes and covers the stack;
   forming second openings that pass through the first mask at a center portion of the first through hole and a center portion of the second through hole, respectively;
   expanding the second openings in the second mask in the horizontal direction to expose the partially expanded first through hole and a top surface of the stack around the partially expanded first through hole and to expose the second through hole and a top surface of the stack around the second through hole; and
   partially etching the stack exposed by the expanded second openings.

6. The method according to claim 5, wherein a difference between a width of the expanded second opening and a width of the expanded first opening is smaller than a difference between the width of the expanded first opening and a width of a lower portion of the first through hole that has not been etched.

7. The method according to claim 5, wherein in the forming of the second openings, the lower portion of the first through hole and the second through hole are used as an overlay key.

8. The method according to claim 5, wherein in the expanding of the second openings, an expansion width of the second openings is adjusted on the basis of a sidewall of the second through hole.

9. A three-dimensional memory device comprising:
   an electrode structure including a plurality of electrode layers and a plurality of interlayer dielectric layers which are alternately stacked on a substrate in a vertical direction; and
   a plurality of through holes, passing through the electrode structure in the vertical direction, that each include at least a first portion and a second portion having a different width, and pad regions are disposed on a surface of an electrode layer at a top of the first portion,
   wherein the second portion is positioned on the first portion and communicates with the first portion and has a greater width than the first portion,
   wherein each pad region is positioned at a lower end of the second portion, which communicates with the first portion,
   wherein at least one of the plurality of through holes further comprises a third portion that is positioned on the second portion, communicates with the second portion and has a larger width than the second portion, and
   wherein a difference in size between a width of the third portion and a width of the second portion is smaller than a difference in size between the width of the second portion and a width of the first portion.

10. The three-dimensional memory device according to claim 9, wherein the plurality of through holes comprise:
    a first through hole in which the width of the third portion has a first size; and
    a second through hole in which the width of the second portion has the first size, and
    wherein a thickness of the third portion of the first through hole and a thickness of the second portion of the second through hole are the same as each other.

11. The three-dimensional memory device according to claim 9, wherein the substrate comprises:
    a first cell array region and a second cell array region in which a plurality of vertical channels passing through the electrode structure to extend to the substrate are positioned; and a connection region disposed between the first cell array region and the second cell array region, wherein the plurality of through holes are disposed in the connection region.

* * * * *